US 11,394,399 B2

(12) United States Patent
Li et al.

(10) Patent No.: US 11,394,399 B2
(45) Date of Patent: Jul. 19, 2022

(54) SELF-DECODABLE REDUNDANCY VERSIONS FOR POLAR CODES

(71) Applicant: Qualcomm Incorporated, San Diego, CA (US)

(72) Inventors: Jian Li, Beijing (CN); Changlong Xu, Beijing (CN); Liangming Wu, Beijing (CN); Kai Chen, Shenzhen (CN); Hao Xu, Beijing (CN); Jing Jiang, San Diego, CA (US); Joseph Binamira Soriaga, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 8 days.

(21) Appl. No.: 16/968,920

(22) PCT Filed: Feb. 14, 2019

(86) PCT No.: PCT/CN2019/075091
§ 371 (c)(1),
(2) Date: Aug. 11, 2020

(87) PCT Pub. No.: WO2019/158112
PCT Pub. Date: Aug. 22, 2019

(65) Prior Publication Data
US 2021/0050865 A1   Feb. 18, 2021

(30) Foreign Application Priority Data

Feb. 15, 2018  (WO) ................ PCT/CN2018/076915

(51) Int. Cl.
*H03M 13/13*     (2006.01)
*H04L 1/00*      (2006.01)
*H04L 1/08*      (2006.01)

(52) U.S. Cl.
CPC .......... *H03M 13/13* (2013.01); *H04L 1/0041* (2013.01); *H04L 1/0057* (2013.01); *H04L 1/08* (2013.01)

(58) Field of Classification Search
CPC ..... H03M 13/13; H03M 13/45; H04L 1/0041; H04L 1/0057; H04L 1/08
See application file for complete search history.

(56) References Cited

U.S. PATENT DOCUMENTS

2016/0294418 A1   10/2016   Huang et al.
2017/0111060 A1    4/2017   Huang et al.
(Continued)

FOREIGN PATENT DOCUMENTS

CN     103281166 A     9/2013
CN     105811998 A     7/2016
(Continued)

OTHER PUBLICATIONS

International Search Report and Written Opinion—PCT/CN2018/076915—ISA/EPO—dated Nov. 19, 2018.
(Continued)

*Primary Examiner* — Shelly A Chase
(74) *Attorney, Agent, or Firm* — Holland & Hart LLP

(57) ABSTRACT

Methods, systems, and devices for wireless communications are described. A transmitting device, such as a base station or a user equipment (UE), may generate a first set of encoded bits using a polar code. The transmitting device may transmit the first set of encoded bits to a receiving device, but the receiving device may unsuccessfully receive the transmission. The transmitting device may prepare a retransmission by generating a second set of encoded bits. In some cases, the transmitting device may copy information bits from the first transmission to polarized channels when generating the polar code for the retransmission. The transmitting device
(Continued)

may copy information bits based on how the information bits were assigned for the first transmission as well as the block length. The transmitting device may copy information bits such that the retransmission is self-decodable.

42 Claims, 12 Drawing Sheets

(56) References Cited

U.S. PATENT DOCUMENTS

| | | | |
|---|---|---|---|
| 2017/0338996 A1 | 11/2017 | Sankar et al. | |
| 2018/0351693 A1* | 12/2018 | Jang | H03M 13/45 |
| 2019/0207720 A1* | 7/2019 | Li | H03M 13/13 |
| 2019/0280804 A1* | 9/2019 | Zhang | H04L 1/0045 |

FOREIGN PATENT DOCUMENTS

| | | |
|---|---|---|
| CN | 106464446 A | 2/2017 |
| CN | 106936548 A | 7/2017 |
| WO | WO-2017156792 A1 | 9/2017 |
| WO | WO-2018126433 A1 | 7/2018 |
| WO | WO-2019023244 A1 | 1/2019 |

OTHER PUBLICATIONS

International Search Report and Written Opinion—PCT/CN2019/075091—ISA/EPO—dated May 15, 2019.
Huawei, et al., "HARQ Scheme for Polar Codes," 3GPP Draft, 3GPP TSG RAN WG1 Meeting #87, R1-1613301, HARQ Scheme for Polar Codes, 3rd Generation Partnership Project (3GPP), Mobile Competence Centre, 650, Route Des Lucioles F-06921 Sophia-Antipolis Cedex, France, vol. RAN WG1, No. Reno, USA, Nov. 14, 2016-Nov. 18, 2016, Nov. 19, 2016, XP051191170, 41 Pages, Retrieved from the Internet: URL: http://www.3gpp.org/ftp/tsg_ran/WG1_RL1/TSGR1_87/Docs/ [retrieved on Nov. 19, 2016], Section 2, figures 4,5, [Lines 4 to 5 of p. 2 and Lines 1 to 2 of p. 3], Section 2.2 "Incremental Redundancy HARQ Sesign", pp. 3-8, figures 5-7.
Supplementary European Search Report—EP19754019—Search Authority—Munich—dated Oct. 1, 2021.
ZTE, et al., "HARQ Performance of Rate-Compatible Polar Codes", 3GPP Draft, 3GPP TSG-RAN WG1 #87, R1-1613267 HARQ Performance of Rate-Compatible Polar Codes, 3rd Generation Partnership Project (3GPP), Mobile Competence Centre, 650, Route Des Lucioles, F-06921 Sophia-Antipolis Cedex, vol. RAN WG1, No. Reno, US; Nov. 14, 2016-Nov. 18, 2016, Nov. 19, 2016 (Nov. 19, 2016), XP051191139, 8 Pages, Retrieved from the Internet: URL: http://www.3gpp.org/ftp/tsg_ran/WG1_RL1/TSGR1_87/Docs/ [retrieved on Nov. 19, 2016], section 3.

* cited by examiner

| Bit Channel 505-a | Reliability 510-a | Rank 515-a |
|---|---|---|
| 15 | 0.0000 | 15 |
| 14 | 1.0000 | 14 |
| 13 | 1.1892 | 13 |
| 12 | 2.1892 | 10 |
| 11 | 1.4142 | 12 |
| 10 | 2.4142 | 9 |
| 9 | 2.6034 | 8 |
| 8 | 3.6034 | 4 |
| 7 | 1.6818 | 11 |
| 6 | 2.6818 | 7 |
| 5 | 2.8710 | 6 |
| 4 | 3.8710 | 3 |
| 3 | 3.0960 | 5 |
| 2 | 4.0960 | 2 |
| 1 | 4.2852 | 1 |
| 0 | 5.2852 | 0 |

| Bit Channel 505-b | Reliability 510-b | Rank 515-b |
|---|---|---|
| 31 | 0.0000 | 31 |
| 30 | 1.0000 | 30 |
| 29 | 1.1892 | 29 |
| 28 | 2.1892 | 25 |
| 27 | 1.4142 | 28 |
| 26 | 2.4142 | 24 |
| 25 | 2.6034 | 23 |
| 24 | 3.6034 | 16 |
| 23 | 1.6818 | 27 |
| 22 | 2.6818 | 22 |
| 21 | 2.8710 | 21 |
| 20 | 3.8710 | 14 |
| 19 | 3.0960 | 19 |
| 18 | 4.0960 | 13 |
| 17 | 4.2852 | 11 |
| 16 | 5.2852 | 5 |
| 15 | 2.0000 | 26 |
| 14 | 3.0000 | 20 |
| 13 | 3.1892 | 18 |
| 12 | 4.1892 | 12 |
| 11 | 3.4142 | 17 |
| 10 | 4.4142 | 10 |
| 9 | 4.6034 | 9 |
| 8 | 5.6034 | 4 |
| 7 | 3.6818 | 15 |
| 6 | 4.6818 | 8 |
| 5 | 4.8710 | 7 |
| 4 | 5.8710 | 3 |
| 3 | 5.0960 | 6 |
| 2 | 6.0960 | 2 |
| 1 | 6.2852 | 1 |
| 0 | 7.2852 | 0 |

FIG. 5B the assignee hereof which is hereby incorporated by reference in their entirety.

SELF-DECODABLE REDUNDANCY VERSIONS FOR POLAR CODES

CROSS REFERENCES

The present Application is a 371 national phase of International Patent Application No. PCT/CN2019/075091 by Li et al., entitled "SELF-DECODABLE REDUNDANCY VERSIONS FOR POLAR CODES," filed Feb. 14, 2019; and claims benefit of International Patent Application No. PCT/CN2018/076915 to Li et al., entitled "SELF-DECODABLE REDUNDANCY VERSIONS FOR POLAR CODES", filed Feb. 15, 2018, each of which is assigned to the assignee hereof which is hereby incorporated by reference in their entirety.

BACKGROUND

The following relates generally to wireless communications and to self-decodable redundancy versions for polar codes.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long-Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-OFDM (DFT-S-OFDM). A wireless multiple-access communications system may include a number of base stations or network access nodes, each simultaneously supporting communication for multiple communication devices, which may be otherwise known as user equipment (UE).

SUMMARY

Wireless devices may employ enhanced polar hybrid automatic repeat request (HARQ) operation techniques for performing retransmissions of polar encoded data. For example, a transmitting device may generate a first set of encoded bits by encoding information bits using a polar code of a first size, N, and transmit the first set of encoded bits to a receiving device. After determining the receiving device failed to decode the encoded bits, the transmitting device may generate a second set of encoded bits by encoding the information bits using a polar code of a second size, 2N. In some cases, the transmitting device may use the first set of encoded bits and one or more copied information bits to generate the second set of encoded bits. The transmitting device may transmit the second set of encoded bits to the receiving device. The transmitting device may copy information bits such that the retransmission including the second encoded bits is self-decodable. For example, the transmitting device may copy the information bits based on the polarized bit channels that are assigned information bits for the first transmission and the block size of the transmission and retransmission.

A method of wireless communication is described. The method may include receiving a first set of encoded bits from a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels, transmitting, to the device, an indication that decoding of the first set of encoded bits was unsuccessful, receiving a second set of encoded bits from the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set, and decoding the second set of encoded bits according to the second polar code to obtain the information bit vector.

An apparatus for wireless communication is described. The apparatus may include means for receiving a first set of encoded bits from a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels, means for transmitting, to the device, an indication that decoding of the first set of encoded bits was unsuccessful, means for receiving a second set of encoded bits from the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set, and means for decoding the second set of encoded bits according to the second polar code to obtain the information bit vector.

Another apparatus for wireless communication is described. The apparatus may include a processor, memory in electronic communication with the processor, and instructions stored in the memory. The instructions may be operable to cause the processor to receive a first set of encoded bits from a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels, transmit, to the device, an indication that decoding of the first set of encoded bits was unsuccessful, receive a second set of encoded bits from the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set, and decode the second set of encoded bits according to the second polar code to obtain the information bit vector.

A non-transitory computer-readable medium for wireless communication is described. The non-transitory computer-readable medium may include instructions operable to cause a processor to receive a first set of encoded bits from a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels, transmit, to the device, an indication that decoding of the first set of encoded bits was unsuccessful, receive a second set of encoded bits from the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set, and decode the second set of encoded bits according to the second polar code to obtain the information bit vector.

In some examples of the method, apparatus, and non-transitory computer-readable medium described herein, the at least one of the second set of polarized bit channels includes bit channels of the third bit index set that may be not in the first bit index set.

In some examples of the method, apparatus, and non-transitory computer-readable medium described herein, the decoding includes decoding the first and second sets of encoded bits according to the second polar code to obtain the information bit vector.

In some examples of the method, apparatus, and non-transitory computer-readable medium described herein, the second polar code includes the first polar code.

In some examples of the method, apparatus, and non-transitory computer-readable medium described herein, the first set of encoded bits includes a subset of encoded bits of a codeword generated by the first polar code.

In some examples of the method, apparatus, and non-transitory computer-readable medium described herein, the second set of encoded bits includes a second subset of encoded bits of a second codeword generated by the second polar code.

In some examples of the method, apparatus, and non-transitory computer-readable medium described herein, the second set of encoded bits may have a same bit length as the first set of encoded bits.

In some examples of the method, apparatus, and non-transitory computer-readable medium described herein, the second set of encoded bits may have a different bit length as the first set of encoded bits.

In some examples of the method, apparatus, and non-transitory computer-readable medium described herein, the second polar code may have a second code length that may be two times the first code length.

In some examples of the method, apparatus, and non-transitory computer-readable medium described herein, a bit order for the at least one bit of the information bit vector in the at least one of the second set of polarized bit channels corresponds to an order of respective bit channel indices corresponding to the bit channels of the first bit index set that may be not in the third bit index set.

A method of wireless communication is described. The method may include transmitting a first set of encoded bits to a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels, receiving, from the device, an indication that decoding of the first set of encoded bits was unsuccessful, and transmitting a second set of encoded bits to the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set.

An apparatus for wireless communication is described. The apparatus may include means for transmitting a first set of encoded bits to a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels, means for receiving, from the device, an indication that decoding of the first set of encoded bits was unsuccessful, and means for transmitting a second set of encoded bits to the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set.

Another apparatus for wireless communication is described. The apparatus may include a processor, memory in electronic communication with the processor, and instructions stored in the memory. The instructions may be operable to cause the processor to transmit a first set of encoded bits to a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels, receive, from the device, an indication that decoding of the first set of encoded bits was unsuccessful, and transmit a second set of encoded bits to the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set.

A non-transitory computer-readable medium for wireless communication is described. The non-transitory computer-readable medium may include instructions operable to cause a processor to transmit a first set of encoded bits to a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels, receive, from the device, an indication that decoding of the first set of encoded bits was unsuccessful, and transmit a second set of encoded bits to the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set.

In some examples of the method, apparatus, and non-transitory computer-readable medium described herein, the at least one of the second set of polarized bit channels includes bit channels of the third bit index set that may be not in the first bit index set.

In some examples of the method, apparatus, and non-transitory computer-readable medium described herein, the second polar code includes the first polar code.

In some examples of the method, apparatus, and non-transitory computer-readable medium described herein, the first set of encoded bits includes a subset of encoded bits of a codeword generated by the first polar code.

In some examples of the method, apparatus, and non-transitory computer-readable medium described herein, the second set of encoded bits includes a second subset of encoded bits of a second codeword generated by the second polar code.

In some examples of the method, apparatus, and non-transitory computer-readable medium described herein, the second set of encoded bits may have a same bit length as the first set of encoded bits.

In some examples of the method, apparatus, and non-transitory computer-readable medium described herein, the second set of encoded bits may have a different bit length as the first set of encoded bits.

In some examples of the method, apparatus, and non-transitory computer-readable medium described herein, the second polar code may have a second code length that may be two times the first code length.

In some examples of the method, apparatus, and non-transitory computer-readable medium described herein, a bit order for the at least one bit of the information bit vector in the at least one of the second set of polarized bit channels corresponds to an order of respective bit channel indices corresponding to the bit channels of the first bit index set that may be not in the third bit index set.

BRIEF DESCRIPTION OF THE DRAWINGS

FIGS. 5A and 5B illustrate examples of reliability tables that support self-decodable redundancy versions for polar codes in accordance with aspects of the present disclosure.

DETAILED DESCRIPTION

Figure 1:
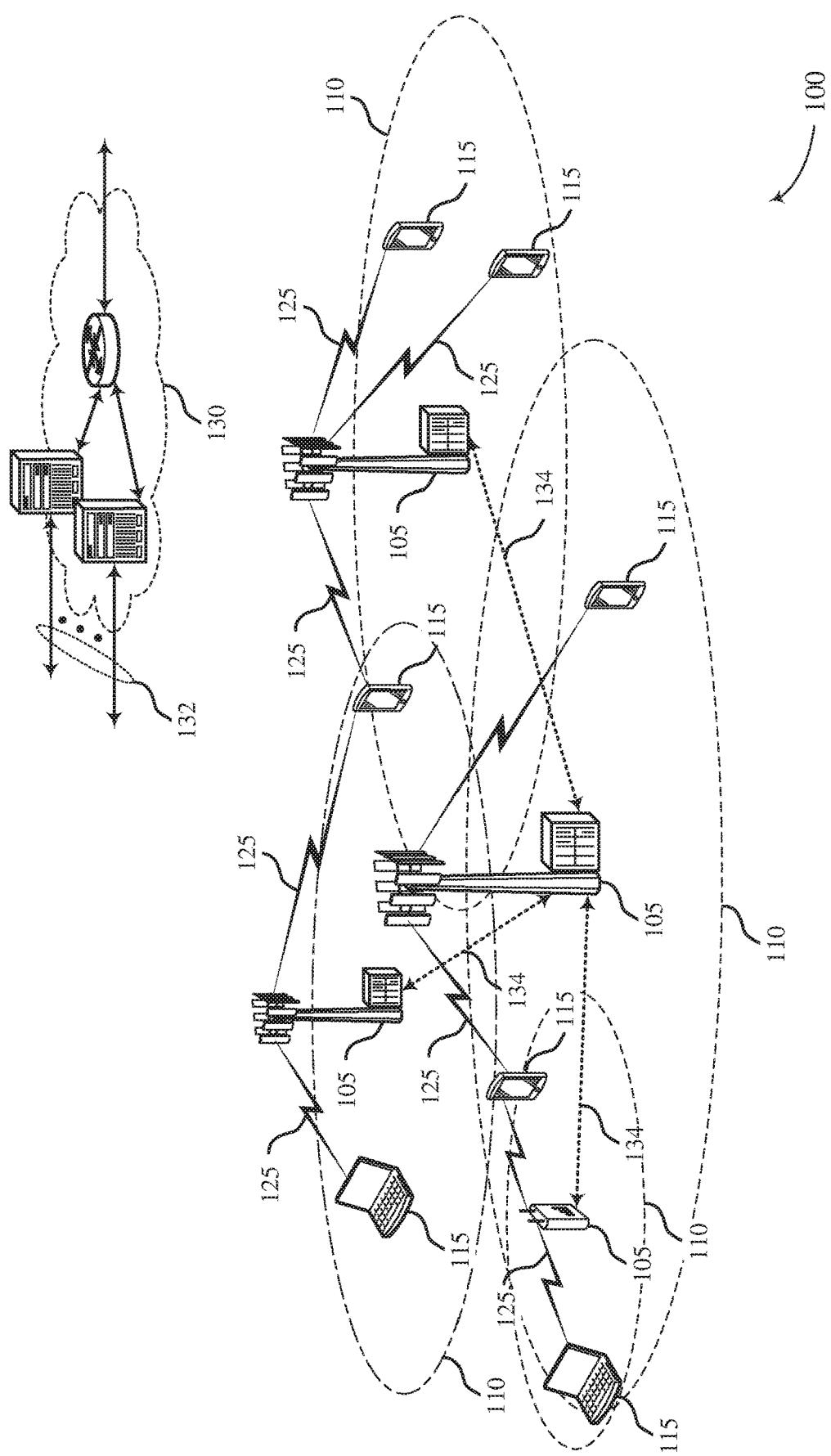
FIG. 1 illustrates an example of a system for wireless communication that supports self-decodable redundancy versions for polar codes in accordance with aspects of the present disclosure.

In some cases, wireless communications between a user equipment (UE) and base station may fail—e.g., due to degraded channel conditions, increased interference, etc. Techniques, such as coding schemes and hybrid automatic repeat request (HARQ) operation, may be used by wireless devices to increase the reliability of wireless communications. In some examples, a transmitting wireless device encodes information bits intended for another wireless device and transmits the encoded bits to the other wireless device. Polar encoding may increase the likelihood that the information bits are successfully received at the other wireless device since each encoded bit may provide additional information for decoding another encoded bit. Polar coding aside, a receiving wireless device may still fail to successfully decode received encoded bits, in which case the receiving wireless device may indicate to the transmitting device when a decoding fails. If HARQ operation is active, the transmitting device may then prepare a retransmission using polar coding and transmit the retransmission of the information bits to the receiving wireless device.

Accordingly, polar encoding may be used in combination with HARQ operation (or "polar HARQ operation") to increase the reliability of data transmissions over a wireless transmission link. A polar HARQ operation may include encoding information bits using a polar code to generate a codeword of a first size for a transmission and transmitting some portion of a codeword generated from the information bits using a polar code of a second (e.g., larger) size for a retransmission. The likelihood of decoding information bits encoded with a larger polar code (e.g., size 2N) may be greater than the likelihood of decoding information encoded with a smaller polar code (e.g., size N). In some cases, wireless devices may employ enhanced polar HARQ operation techniques for performing retransmissions of polar encoded data.

In one example, a transmitting device encodes information bits for a receiving device using a first polar code of a first size (e.g., N), yielding a first set of encoded bits. To provide coding gain, the number of encoded bits is greater than the number of information bits. The first set of encoded bits may be a subset or all of a first codeword generated by the first polar code. The transmitting device may transmit the first set of encoded bits to the receiving device. In some cases, the receiving device receives the first set of encoded bits but fails to successfully decode the first codeword. The transmitting device may determine that the decoding was unsuccessful—e.g., based on receiving an indication from the receiving device or failing to receive any response from the receiving device—and prepare a retransmission to the receiving device.

The transmitting device may generate a second set of encoded bits for the retransmission using a second polar code (e.g., of size 2N). In some cases, the second polar code may be understood as having a generator matrix that is a superset of a generator matrix of the first polar code. In some cases, the transmitting device may assign known (or "frozen") bits to the polarized bit channels of the second polar code that are not in the first polar code. Where logic 0s are used as the frozen bits, using all frozen bits for the polarized bit channels of the second polar code that are not in the first polar code results in the same bit values as the first set of encoded bits. In some cases, the first and second sets of encoded bits together may be considered as making up a second codeword that can be decoded using the second, larger polar code (e.g., having an effective size of 2N).

The transmitting device may transmit the second set of encoded bits to the receiving device, which may receive the second set of encoded bits and decode the second codeword using both the received first set of encoded bits and the received second set of encoded bits. As discussed herein, the likelihood of decoding information bits encoded using a larger polar code may be higher than if the information bits were encoded using a smaller polar code. Thus, the receiving device may successfully decode the second codeword. In other cases, the receiving device may fail to decode the second codeword, in which case, the transmitting device may similarly generate a third set of encoded bits and a third codeword may be understood as including the first set of encoded bits, the second set of encoded bits, and the third set of encoded bits. In some cases, the third codeword may be associated with an effective polar code size of 2N. Alternatively, the third codeword may be associated with a third polar code with a polar code size of 4N. More generally, the effective polar code size for a retransmission is $2^{(ceil(log_2(N_1+N_2+N_3+\cdots+N_n)))}$, where $N_1$ represents the number of encoded bits generated by the first polar code, $N_2$ represents the number of encoded bits generated by the second polar code, and so on.

In some examples, the transmitting device may copy one or more of the information bits to one or more polarized bit channels of the second polar code when generating the second set of encoded bits. For instance, the transmitting device may copy an information bit to a polarized bit channel of the second polar code if a reliability of the polarized bit channel of the second polar code is greater than a reliability of a polarized bit channel of the first polar code used by the information bit (as mapped to the second polar code). As described, the transmitting device may copy information bits to the polarized bit channels of the second polar code such that the retransmission is self-decodable. For example, polarized bit channels for the retransmission may be selected to carry information bits based on which polarized bit channels carried information bits for the first transmission and the block size of the first transmission.

Aspects of the disclosure are initially described in the context of a wireless communications system. Aspects of the disclosure are further illustrated by and described with reference to apparatus diagrams, system diagrams, and flowcharts that relate to self-decodable redundancy versions for polar codes.

FIG. 1 illustrates an example of a wireless communications system 100 that supports self-decodable redundancy versions for polar codes in accordance with aspects of the present disclosure. The wireless communications system 100 includes base stations 105, UEs 115, and a core network 130. In some examples, the wireless communications system 100 may be a Long-Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1 or other interface). Base stations 105 may communicate with one another over backhaul links 134 (e.g., via an X2 or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 MHz to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that can tolerate interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a carrier aggregation (CA) configuration in conjunction with component carriers (CCs) operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105. Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115) or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a set of antenna elements of an antenna array, or by processing received signals according to different receive beamforming weight sets applied to signals received at a set of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based on listening according to different receive beam directions (e.g., a beam direction determined to have a highest signal strength, highest signal-to-noise ratio, or otherwise acceptable signal quality based on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use HARQ to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200$ $T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an evolved terrestrial radio access (E-UTRA) absolute radio frequency channel number (EARFCN)) and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as orthogonal frequency division multiplexing (OFDM) or discrete Fourier transform-spread OFDM (DFT-s-OFDM)).

The organizational structure of the carriers may be different for different radio access technologies (e.g., LTE, LTE-A, LTE-A Pro, NR, etc.). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or resource blocks (RBs)) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth or may be configurable to support communications over one of a set of carrier bandwidths. In some examples, the wireless communications system 100 may include base stations 105 and/or UEs 115 that can support simultaneous communications via carriers associated with more than one different carrier bandwidth.

Wireless communications system 100 may support communication with a UE 115 on multiple cells or carriers, a feature which may be referred to as CA or multi-carrier operation. A UE 115 may be configured with multiple downlink CCs and one or more uplink CCs according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other CCs, which may include use of a reduced symbol duration as compared with symbol durations of the other CCs. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications systems such as an NR system may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

A transmitting device, which examples of a base station 105 or a UE 115 as described herein, may generate a first codeword of size N using a polar code, the first codeword including a first set of encoded bits. The transmitting device may transmit the first codeword to a receiving device (e.g., a UE 115 or base station 105). The transmitting device may determine that the first codeword was not successfully received and prepare a retransmission according to a polar HARQ operation. The transmitting device may generate a second codeword of size 2N, including the first set of encoded bits and a second set of encoded bits. The transmitting device may assign frozen bits (e.g., 0's) to the polarized bit channels of the second polar code that are not in the first polar code when generating the second codeword.

In some cases, the transmitting device may copy one or more information bits to one or more of the polarized bit channels of the second polar code of that are not in the first polar code when generating the second set of encoded bits. In some cases, the bit channels of the second polar code may be assigned information bits based on reliability. A transmitting device and receiving device described herein, such as a base station 105 or a UE 115, may implement techniques to generate self-decodable retransmissions according to a polar HARQ scheme. Thus, in some cases, a receiving device may be able to independently decode the retransmission and obtain the information bits in circumstances where the transmission is unavailable.

Figure 2:
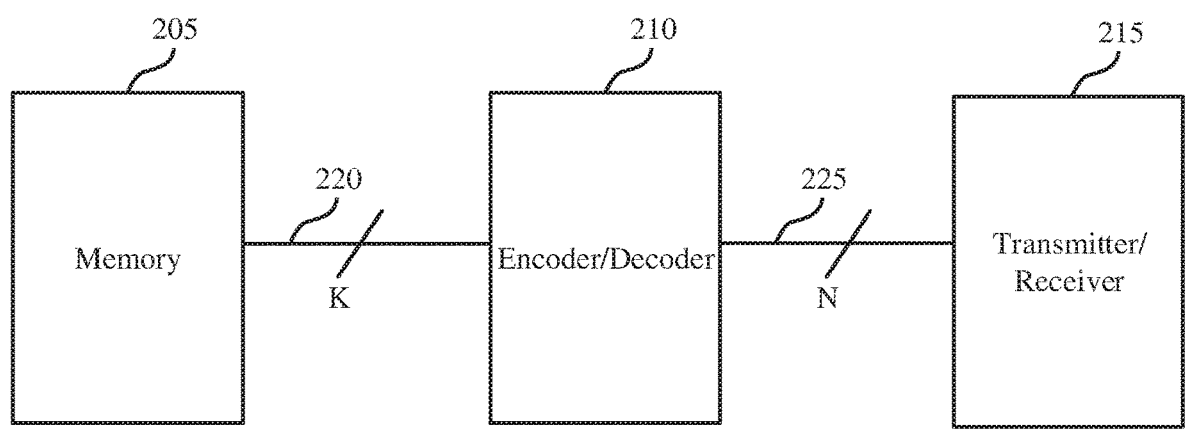
FIG. 2 illustrates an example of a device that supports self-decodable redundancy versions for polar codes in accordance with aspects of the present disclosure.

FIG. 2 illustrates an example of a device 200 that supports enhanced polar code construction in accordance with various aspects of the present disclosure. In some examples, device 200 may implement aspects of wireless communication system 100. The device 200 may be any device within a wireless communications system 100 that performs an encoding or decoding process (e.g., using an error-correcting code, such as a polar code). Device 200 may be an example of a UE 115 or a base station 105 as described with reference to FIG. 1.

As shown, device 200 includes a memory 205, an encoder/decoder 210, and a transmitter/receiver 215. First bus 220 may connect memory 205 to encoder/decoder 210 and second bus 225 may connect encoder/decoder 210 to transmitter/receiver 215. In some cases, device 200 may have data stored in memory 205 to be transmitted to another device, such as a UE 115 or base station 105. To initiate the transmission process, device 200 may retrieve from memory 205 the data for transmission. The data may include a number of payload bits, 'A,' which may be 1 s or 0 s, provided from memory 205 to encoder/decoder 210 via first bus 220. In some cases, these payload bits may be combined with a number of parity or error checking bits, 'E,' to form a total set of information bits, 'A+E.' The number of information bits may be represented as a value 'K,' as shown. The encoder/decoder 210 may implement a polar code with a block length, 'N,' for encoding the information bits, where N may be different than or the same as K. Such a polar code may be referred to as an (N, K) polar code. In some cases, the bits that not allocated as information bits (i.e., N−K bits) may be assigned as frozen bits.

In some cases, to perform a polar coding operation, the encoder 210 may generate a codeword of length, 'M,' where M is a power of 2 (i.e., $M=2^m$ where m is an integer value). If N is not a power of 2, the encoder 210 may round the value of N up to the nearest valid M value. For example, if N=400, the encoder 210 may determine a codeword length of M=512 (e.g., the nearest valid value for M greater than or equal to N) in order to support polar coding. In these cases, the encoder 210 may encode a codeword of length M, and then may puncture a number of bits M-N to obtain a codeword of the specified block length N for transmission.

The encoder 210 may attempt to assign the information bits to the K most reliable bit channels, and the frozen bits to the remaining bit channels. The encoder/decoder 210 may use a variety of techniques to select the most reliable bit channels. For example, polarization weight (PW), generator weight (GW), or density evolution (DE) are common techniques used for estimating bit channel reliability for polar codes. In some cases (e.g., for large values of M or N, such as M=1024), the encoder/decoder 210 may implement fractally enhanced kernel (FRANK) polar code construction for assigning the K information bits to the most (or an estimation of the most) reliable bit channels. FRANK polar code construction may provide better estimates of bit channel reliability than some polar coding schemes (e.g., PW, GW, etc.), and may be less complex than other polar coding schemes (e.g., DE). Additionally, FRANK polar code construction may allow the encoder 210 to flexibly adapt the coding rate when generating codewords via puncturing. The encoder 210 may determine information bit channels based on FRANK polar code construction and may assign frozen bits to the remaining channels. Frozen bits may be bits of a default value (e.g., 0, 1, etc.) known to both the encoder and decoder (i.e., the encoder encoding information bits at a transmitter and the decoder decoding the codeword received at a receiver). Further, from the receiving device perspective, device 200 may receive a data signal representing the codeword via receiver 215 and may decode the signal using decoder 210 to obtain the transmitted data.

In some wireless systems, decoder 210 may be an example of a successive cancellation (SC) or a successive cancellation list (SCL) decoder. A UE 115 or base station 105 may receive a transmission including a set of encoded bits of a codeword (e.g., symbol information representing the unpunctured bits of the codeword) at receiver 215 and may send the transmission to the SCL decoder (e.g., decoder 210). The SCL decoder may determine input logarithmic-likelihood ratios (LLRs) for the bit channels of the received codeword. During decoding, the SCL decoder may determine decoded LLRs based on these input LLRs, where the decoded LLRs correspond to each bit channel of the polar code. These decoded LLRs may be referred to as bit metrics. In some cases, if the LLR is zero or a positive value, the SCL decoder may determine the corresponding bit is a 0 bit, and a negative LLR may correspond to a 1 bit. The SCL decoder may use the bit metrics to determine the decoded bit values.

The SCL decoder may employ multiple concurrent SC decoding processes. Each SC decoding process may decode the codeword sequentially (e.g., in order of the bit channel indices). Due to the combination of multiple SC decoding processes, the SCL decoder may calculate multiple decoding path candidates. For example, an SCL decoder of list size 'L' (i.e., the SCL decoder has L SC decoding processes) may calculate L decoding path candidates, and a corresponding reliability metric (e.g., a path metric) for each decoding path candidate. The path metric may represent a reliability of a decoding path candidate or a probability that the corresponding decoding path candidate is the correct set of decoded bits. The path metric may be based on the determined bit metrics and the bit values selected at each bit channel. For example, the SCL decoder may extend each of the L decoding path candidates with both 0 and 1 bit values at information bit locations and determine path metrics for each of the resulting 2L decoding path candidates. The SCL decoder may update path metrics at frozen bit locations for each of the L decoding path candidates. The SCL decoder may have a number of levels equal to the number of bit channels in the received codeword. At each level, each decoding path candidate may select either a 0 bit or a 1 bit based on a path metric of the 0 bit and the 1 bit. The SCL decoder may select a decoding path candidate based on the path metrics and may output the bits corresponding to the selected decoding path as the decoded sets of bits. For example, the SCL decoder may select the decoding paths with the highest path metrics.

The transmitting devices and receiving devices may also use HARQ operations to increase the reliability of a communications link. HARQ operation may include retransmitting information related to previously transmitted codewords one or more times, allowing a receiving device to perform successive decoding operations. Each decoding operation may provide the receiving device with additional information for decoding and increase the likelihood of a successful decoding of the codeword. In some cases, retransmissions benefit from improved channel conditions or enhanced transmit parameters relative to the first transmission, further increasing the likelihood of a successful decoding of the codeword.

In some examples, transmitting devices and receiving devices may use polar coding in combination with HARQ operation to further increase the reliability of a communications link. As discussed above, polar codes approach the theoretical channel capacity as the code length increases, and each retransmission for a HARQ operation may effectively increase the code length of a data transmission as well as providing more codeword information (increasing coding gain). In some cases, a first transmission may be associated with a polar code of a first size N and a first codeword, a first retransmission may be associated with a polar code of a second size 2N and a second codeword, a second retransmission may be associated with a polar code of the second size or a third size (e.g., 4N) and a third codeword, and so on. Thus, the likelihood of decoding each successive codeword may increase.

As described above, each sub-channel, or polarized bit channel, of a polar code may be associated with a reliability, and the reliability of some sub-channels may be higher than others. In the context of HARQ operation, a first set of sub-channels of the effective polar code used to generate the first codeword may have first reliabilities and a second set of sub-channels of the effective polar code used to generate the second codeword may have second reliabilities. In some cases, the first and second reliabilities are based on increases in code length and transmission parameters including puncturing. Thus, the reliabilities of some of the second sub-channels may be improved relative to the reliabilities of the first sub-channels.

In some cases, a transmitting device may copy one or more information bits used to generate the first codeword to one or more of the second sub-channels. In some cases, the information bits may be copied from the first set of sub-channels to the second set of sub-channels such that the first retransmission is self-decodable, as described in FIGS. 3 and 5. For example, the transmitting device may copy the information bits based on the polarized bit channels assigned to information bits for the first transmission and the block size.

Figure 3:
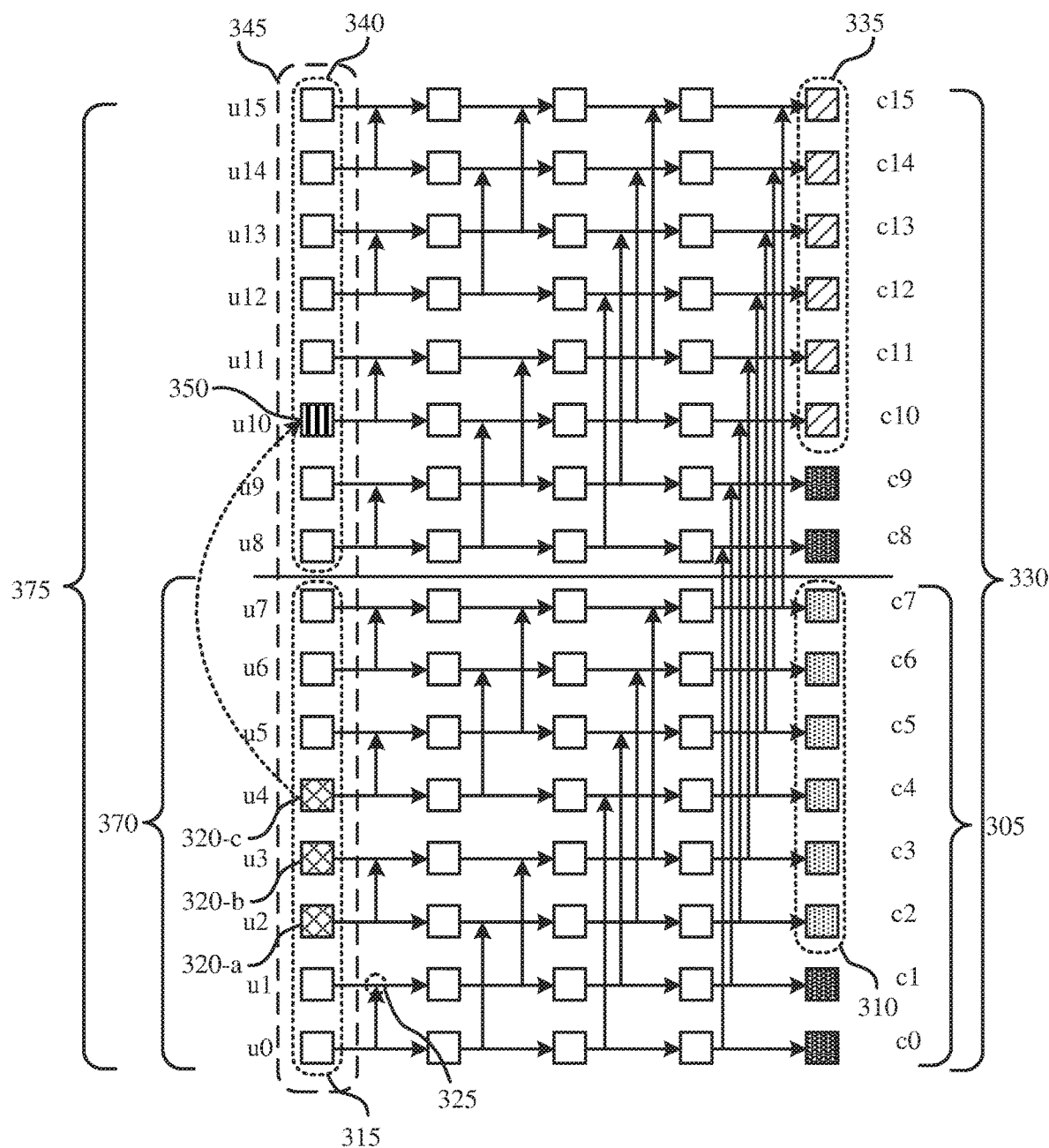
FIG. 3 illustrates an example of an encoding scheme that supports self-decodable redundancy versions for polar codes in accordance with aspects of the present disclosure.

FIG. 3 illustrates an example of an encoding scheme 300 that supports self-decodable HARQ retransmissions for polar codes in accordance with various aspects of the present disclosure. Encoding scheme 300 may illustrate aspects of a transmission between a UE 115 and a base station 105, as described above with reference to FIGS. 1-2. Encoding scheme 300 may include first codeword 305, generated using first polarized bit channels 315, information bits 320-*a* to 320-*c*, and XOR operations 325. In some cases, a first set of encoded bits 310 of codeword 305 may be transmitted by a transmitting device as a first encoded transmission.

As shown, transmitting device may use a block length of M=6 to transmit K=3 information bits. The transmitting device may round up to determine the first polar code 370 of size N=8, and puncture two bits of the encoded bits 310 (i.e., corresponding to punctured bits 355) to generate a codeword of the block length M. The transmitting device may generate the first codeword 305, by identifying the K most reliable bit channels of the N bit channels in the first polarized bit channels 315. In some cases, most reliable bit channels, bit channels 2, 3, and 4, are mapped with information bits 320-*a*, 320-*b*, and 320-*c*, respectively. The K bit channels selected for information bits of the first polarized bit channels 315 may be referred to as a first set of bit channels, A. As described, $A=\{i_0, i_1, \ldots, i_{K-1}\}$, $0 \geq N$ may be the indices set of the information bits in the U-domain, where the corresponding payloads are denoted as $\{u_0, u_1, \ldots, u_{K-1}\}$. In the U-domain, $u_8 = [0, 0, u_0, u_1, u_2, 0, 0, 0]$, where $u_8$ corresponds to the 8 bit channels in the first polarized bit channels 315, showing that information bits are on bit channels 2, 3, and 4. The transmitting device may generate the first codeword 305 of size N=8, and puncture two bits to generate a codeword of length M=6.

The receiving device may not successfully decode the first encoded bits 310. In some cases, the receiving device may indicate the failure (e.g., in a negative acknowledgment) to the transmitting device. In some other examples, the transmitting device may not receive feedback for the first encoded bits 310, as they were not successfully received by the receiving device (e.g., due to interference, etc.).

The transmitting device may generate and transmit a second set of M=6 encoded bits to the receiving device in a retransmission. As illustrated, the transmitting device may generate the second set of encoded bits according to a second polar code 375 of length 2N. The second polar code 375 may be understood as having a generator matrix that is a superset of the generator matrix associated with the first polar code 370.

Figure 4:
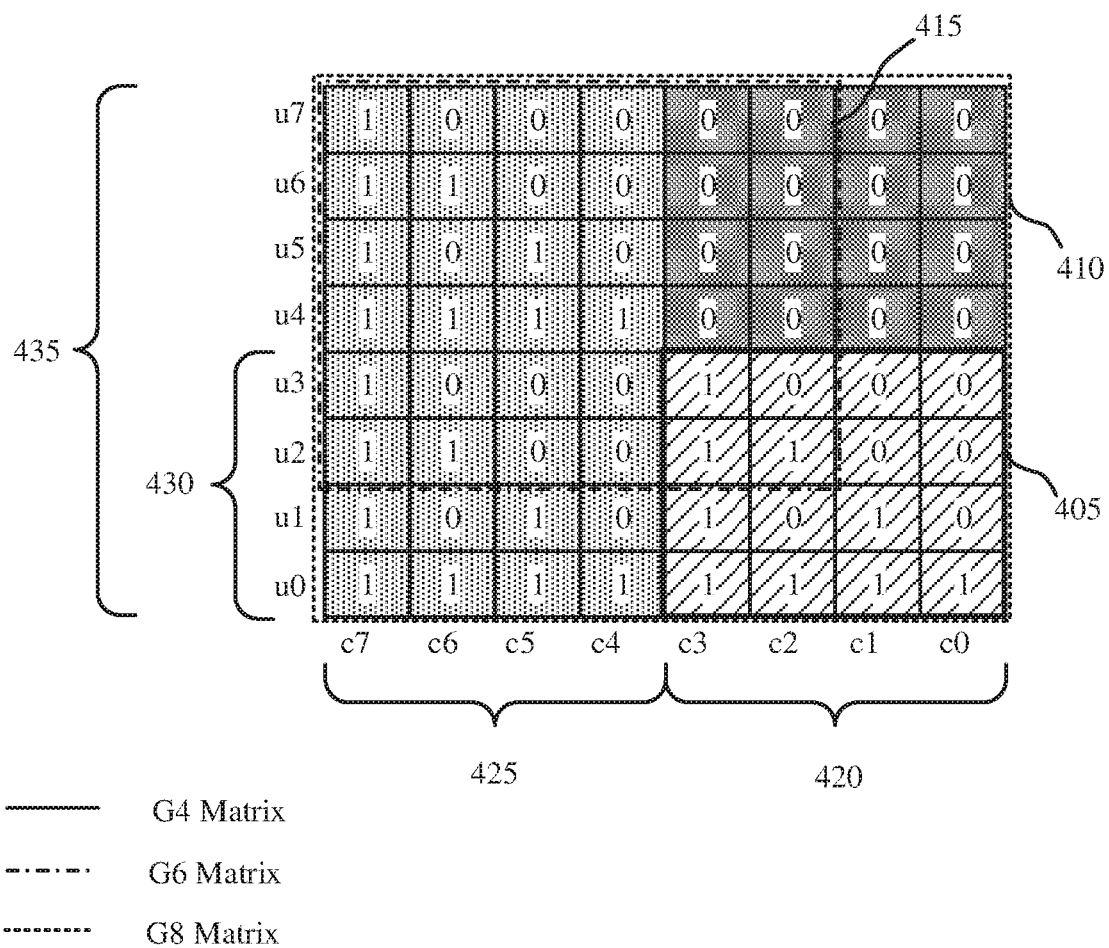
FIG. 4 illustrates an example of generator matrices that support self-decodable redundancy versions for polar codes in accordance with aspects of the present disclosure.

FIG. 4 illustrates an example of generator matrices 00 that support HARQ of polar codes with self-decodable redundancy versions in accordance with aspects of the present disclosure. In some examples, generator matrices 00 may be implemented by aspects of wireless communication system 100.

The generator matrices 400 may include a $G_4$ matrix 405 ("G4"), which is a generator matrix for a 4-bit polar code, and a $G_8$ matrix 410 ("G8"), which is a generator matrix for an 8-bit polar code. A transmitting device as described herein may be capable of using a variety of different generator matrices. The transmitting device may apply puncturing to effectively utilize a generator matrix that is not a power of 2. For example, if codeword bits c1 and c0 are punctured, the coded bits c2-c7 may be effectively encoded using generator matrix G6 415.

A transmitting device may generate a first transmission of a first set of coded bits 420 using the $G_4$ matrix 405. The first set of coded bits 420, corresponding to $c_0$ through $c_3$, may be based on a first set of bit channels 430, corresponding to $u_0$ through $u_3$. For a column of a coded bit, if there is a "1" in a row corresponding to a bit channel, that bit channel is used in determining the coded bit. For example, $c_0$ is based on bit channel $u_0$, $c_1$ is based on bit channels $u_0$ and $u_1$, $c_2$ is based on bit channels $u_0$ and $u_2$, and $c_3$ is based on bit channels $u_0$, $u_1$, $u_2$, and $u_3$.

The transmitting device may allocate information bits to the bit channels. In some cases, the information bits may be allocated based on reliability estimation techniques (e.g., PW, GW, DE, FRANK, or some combination) for polar code construction. The first transmission may have 3 information bits. A first information bit may be assigned to $u_0$, a second information bit may be assigned to $u_1$, and a third information bit may be assigned to $u_2$. A frozen bit may be assigned to the fourth bit channel, $u_3$.

The transmitting device may transmit a second set of coded bits 425 as a retransmission. The second set of coded bits 425 may be generated using the G8 matrix 410. The second set of coded bits 425 may be generated based on the second set of bit channels 435 (which include the first set of bit channels 430). For example, $c_4$ may be based on $u_0$ and $u_4$, and so on.

For the second transmission, the bit values for the first set of bit channels 430 are unchanged (e.g., the information bit values for bit channels $u_0$, $u_1$, $u_2$ are maintained for generating the second set of coded bits 425). This allows the decoder to combine the first set of coded bits 420 and the second set of coded bits 425 to decode the information bits according to the second polar code (e.g., G8 matrix 410). In some cases, the transmitting device may copy an information bit from the first set of bit channels 430 used for the first transmission to a bit channel in the second set of bit channels 435 that is not in the first set of bit channels 430 for the second transmission (i.e., as described in FIGS. 3 and 5). For example, the information bit assigned to $u_2$ may also be assigned to information bit $u_4$. In some cases, the other bit channels in the second set of bit channels 435 may be assigned frozen bits (e.g., known values of 0 or 1).

A generator matrix for a code length N, $G_N$, may be used to determine a generator matrix for a code length 2N. For example, $$G_{2N} = \begin{bmatrix} G_N & 0 \\ G_N & G_N \end{bmatrix}.$$

As shown, if $G_4$ is the 4×4 matrix in the bottom right quadrant, then $G_4$ is duplicated in the bottom left quadrant and top left quadrant of the $G_8$ matrix, and a 4×4 Zero matrix occupies the top right quadrant of the $G_8$ matrix. In this way, the first set of coded bits has zeroes occupying the corresponding rows for the second set of bit channels 435. Thus, the bit channels of the second set of bit channels 435 that are not in the first set of bit channels 430 do not affect the first set of coded bits 420.

Returning to FIG. 3, the transmitting device may generate and transmit the second set of M=6 encoded bits to the receiving device in a retransmission. As illustrated, the transmitting device may generate the second set of encoded bits according to a second polar code 375 of length 2N. The second polar code 375 may be understood as having a generator matrix that is a superset of the generator matrix associated with the first polar code 370.

In some cases, to improve reliability, the transmitting device may copy information bits 320 to second polarized bit channels 340 when generating second encoded bits 335. In some examples, the transmitting device may map information bits 320-a to 320-c to first polarized bit channels 315 based on first bit channel reliabilities of first polarized bit channels 315 for a first transmission. For instance, the transmitting device may map information bits to the highest reliability polarized bit channels. The transmitting device may then transmit encoded bits 310 to a receiving device. If the receiving device fails to properly decode first encoded bits 310, then the transmitting device may prepare a retransmission. In some cases, a retransmission may not be self-decodable if information bits are mapped to a second bit channel based only on reliability. Transmitting devices described herein may generate HARQ transmissions of polar codes with self-decodable redundancy versions.

For instance, the transmitting device may identify a second set of bit channels, B, where B={$i_0$+N, $i_1$+N, . . . , $i_{K-1}$+N}. The transmitting device may combine sets A and B to identify {A,B}={$i_0$, $i_1$, . . . $i_{K-1}$, $i_0$+N, $i_1$+N, $i_{K-1}$+N}. The transmitting device may determine a set of bit channels, C, where the bit channels in C are the bit channels with the highest reliability from the set {A, B}. For example, A={2, 3,4}, B={10, 11, 12}, {A, B}={2, 3, 4, 10, 11, 12}, and C={2, 3, 10}. In this example, the payloads of A={2, 3, 4} correspond to {$u_0$, $u_1$, $u_2$}, as they do for the first transmission. The transmitting device may determine a first subset of bit channels representing the bit channels in both B and C, where B∩C={10}. The transmitting device may also determine a second subset of bit channels representing the bit channels of A which are not in C, where A−A∩C={4}. The transmitting device may copy the information bits from the second subset of bit channels to the first subset of channels. That is, the bit channels in B∩C are given the bit values of A−A∩C. Thus, information bit 320-c is copied from bit channel 4 to bit channel 10, shown as copied bit 350. The mapping of the information bits to the effective 16 bit channels of the 16 bit polar code can be shown as $u_{16}$=[0, 0, $u_0$, $u_1$, $u_2$, 0, 0, 0, 0, 0, $u_2$, 0, 0, 0, 0, 0]. The transmitting device may generate the second codeword 330 based on a second generator matrix of size 16, where $c_{16}$=$u_{16}G_{16}$. The transmitting device may then send six bits (i.e., bits c10-c15) of the second codeword 330 to the receiving device as a retransmission. The described techniques may make the retransmission self-decodable, with a similar self-decodable performance to the first transmission. In some cases, the combined decoding performance may be improved.

The receiving device may receive second encoded bits 335 and may combine second encoded bits 335 with first encoded bits 310 to create second codeword 330. The receiving device may have a higher likelihood of decoding second codeword 330 since each received bit in a polar coded transmission may provide additional information for decoding the information bits.

FIG. 5 illustrates an example of reliability tables 500 and 501 that support HARQ of polar codes with self-decodable redundancy revision in accordance with aspects of the present disclosure. In some examples, reliability tables 500 and 501 may be implemented by aspects of wireless communication system 100.

As an example, a transmitting device may generate a first transmission, including a codeword of length M=16 with K=12 information bits. The transmitting device may determine which 12 bit channels of bit channels 505-a in a $G_{16}$ generator matrix to assign information bits. The transmitting device may sort the reliability values 510-a of each of the bit channels 505-a to obtain a rank 515-a of the reliabilities. In this example, a lower rank corresponds to a higher reliability.

The transmitting device may use various techniques to determine information bit allocation. In this example, the transmitting device may assign information bits to the 12 most reliable bit channels. Generally, the set of most reliable bit locations may be indicated as A={$i_0$, $i_1$, . . . $i_{K-1}$}. Therefore, the transmitting device may assign information bits to a set of bit channels 520 A={0, 1, 2, 3, 4, 5, 6, 7, 8, 9, 10, 12} (e.g., as described in FIG. 3). The transmitting device may generate a codeword of length Musing a generator matrix of size 16, described in FIG. 4. The transmitting device may transmit the first codeword to a receiving device.

The transmitting device may determine that the first transmission was unsuccessfully received. For example, the transmitting device may receive a NACK from the receiving device, or the transmitting device may not receive any sort of feedback from the receiving device at all.

The transmitting device may prepare a retransmission of the data to the receiving device based on determining that the first transmission was unsuccessfully received. The retransmission may be based on a second polar code having a greater code length than the first transmission (e.g., a superset of the first polar code). The transmitting device may copy one or more information bits to the polarized bit channels of the second polar code that are not in the first polar code. The transmitting device may copy information bits such that the second transmission is self-decodable. For example, the transmitting device may use the techniques described herein with reliability table 501 to determine which bit channels 505-b should have the copied information bits.

The transmitting device may determine a second set of bit channels 525, B=$\{i_0+N, i_1+N \ldots i_{k-1}+N\}$. The bit channels in the second set of bit channels 525 may correspond to the bit channels in the first set of bit channels, but shifted by the codeword size N. In this example, N=M=16. Therefore, B=$\{16, 17, 18, 19, 20, 21, 22, 23, 24, 25, 26, 28\}$. The transmitting device may combine the first set and second set, such that $\{A,B\}$=$\{0, 1, 2, 3, 4, 5, 6, 7, 8, 9, 10, 12, 16, 17, 18, 19, 20, 21, 22, 23, 24, 25, 26, 28\}$.

The transmitting device may identify a third set of bit channels, C, including the most reliable bit channels (e.g., according to the reliability values 510-b and reliability rank 515-b) from the combined first set and second set. For example, C=$(A \cap C) \cup (B \cap C)$=$\{0, 1, 2, 3, 4, 5, 6, 8, 9, 10, 16, 17\}$. The transmitting device may construct a 2N encoded vector $u_2N$. For the 2N encoded vector, indices $\{0, 1, \ldots, 2N-1\} - \{A, B\}$ may be assigned frozen bits, indices A may correspond to same bit channels, where A=$\{u_0, u_1, \ldots u_{k-1}\}$. Indices $B \cap C$=$\{16,17\}$ may copy information bits from $A - A \cap C$=$\{7,12\}$. That is, information bits from the information bit vector that are mapped to bit channels of the first set of bit channels that are not in the third set of bit channels are copied to bit channels of the third set of bit channels that are not in the first set of bit channels. Indices $B - B \cap C$ may have a payload of frozen bits. That is, for the 2N encoded vector, bit channels 0 through 15 may remain the same, bit channels 16 and 17 may carry copied information bits from bit channels 7 and 12, and the remaining bit channels in B (e.g., bit channels 18-31) may be assigned frozen bits.

The second transmission may be polar encoded with the size 32 generator matrix, where $C_{32}=u_{32}G_{32}$. The size 32 generator matrix may produce a 32-bit codeword. The transmitting device may identify a second 16-bit codeword consisting of the second half of coded bits, including coded bit 16 to coded bit 31. The transmitting device may transmit the second 16-bit codeword to the receiving device in a retransmission.

Figure 6:
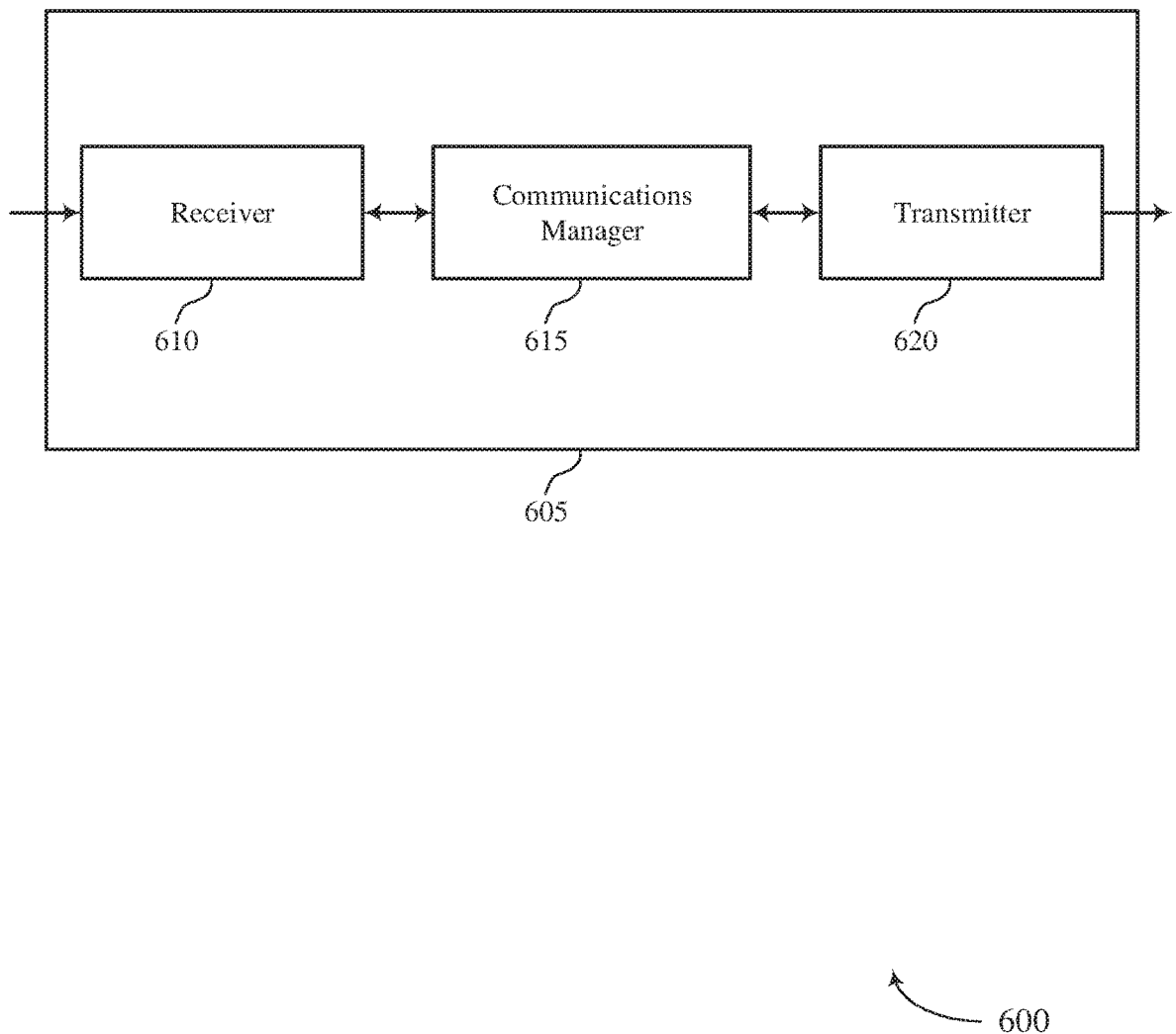
FIGS. 6 through 8 show block diagrams of a device that supports self-decodable redundancy versions for polar codes in accordance with aspects of the present disclosure.

FIG. 6 shows a block diagram 600 of a wireless device 605 that supports self-decodable redundancy versions for polar codes in accordance with aspects of the present disclosure. Wireless device 605 may be an example of aspects of a UE 115 or base station 105 as described herein. Wireless device 605 may include receiver 610, communications manager 615, and transmitter 620. Wireless device 605 may also include a processor. Each of these components may be in communication with one another (e.g., via one or more buses).

Receiver 610 may receive information such as packets, user data, or control information associated with various information channels (e.g., control channels, data channels, and information related to self-decodable redundancy versions for polar codes, etc.). Information may be passed on to other components of the device. The receiver 610 may be an example of aspects of the transceiver 920 or 1020 as described with reference to FIGS. 9 and 10. The receiver 610 may utilize a single antenna or a set of antennas.

Communications manager 615 may be an example of aspects of the communications manager 910 or 1010 as described with reference to FIGS. 9 and 10.

Communications manager 615 and/or at least some of its various sub-components may be implemented in hardware, software executed by a processor, firmware, or any combination thereof. If implemented in software executed by a processor, the functions of the communications manager 615 and/or at least some of its various sub-components may be executed by a general-purpose processor, a digital signal processor (DSP), an application-specific integrated circuit (ASIC), a field-programmable gate array (FPGA) or other programmable logic device (PLD), discrete gate or transistor logic, discrete hardware components, or any combination thereof designed to perform the functions described in the present disclosure. The communications manager 615 and/or at least some of its various sub-components may be physically located at various positions, including being distributed such that portions of functions are implemented at different physical locations by one or more physical devices. In some examples, communications manager 615 and/or at least some of its various sub-components may be a separate and distinct component in accordance with various aspects of the present disclosure. In other examples, communications manager 615 and/or at least some of its various sub-components may be combined with one or more other hardware components, including but not limited to an input/output (I/O) component, a transceiver, a network server, another computing device, one or more other components described in the present disclosure, or a combination thereof in accordance with various aspects of the present disclosure.

Communications manager 615 may receive a first set of encoded bits from a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels. The communications manager 615 may transmit, to the device, an indication that decoding of the first set of encoded bits was unsuccessful and receive a second set of encoded bits from the device. The second set of encoded bits may be generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set. The communications manager 615 may decode the second set of encoded bits according to the second polar code to obtain the information bit vector.

In some cases, the communications manager 615 may transmit a first set of encoded bits to a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels. The communications manager 615 may receive, from the device, an indication that decoding of the first set of encoded bits was unsuccessful and transmit a second set of encoded bits to the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set.

Transmitter 620 may transmit signals generated by other components of the device. In some examples, the transmitter 620 may be collocated with a receiver 610 in a transceiver module. For example, the transmitter 620 may be an example of aspects of the transceiver 920 or 1020 as described with reference to FIGS. 9 and 10. The transmitter 620 may utilize a single antenna or a set of antennas.

Figure 7:
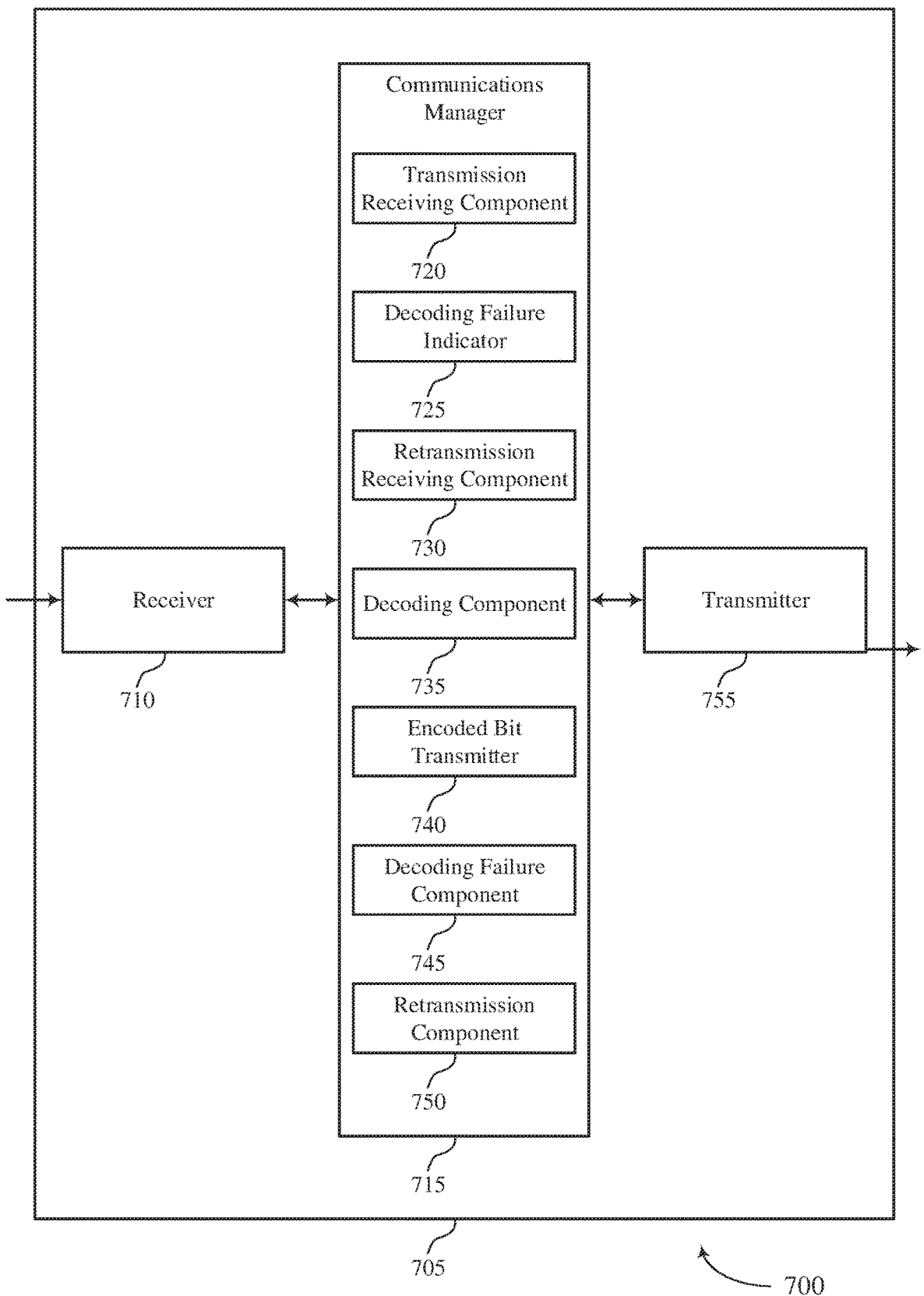

FIG. 7 shows a block diagram 700 of a wireless device 705 that supports self-decodable redundancy versions for polar codes in accordance with aspects of the present disclosure. Wireless device 705 may be an example of aspects of a wireless device 605, a UE 115, or a base station 105 as described with reference to FIGS. 1 and 605. Wireless device 705 may include receiver 710, communications manager 715, and transmitter 755. Wireless device 705 may also include a processor. Each of these components may be in communication with one another (e.g., via one or more buses).

Receiver 710 may receive information such as packets, user data, or control information associated with various information channels (e.g., control channels, data channels, and information related to self-decodable redundancy versions for polar codes, etc.). Information may be passed on to other components of the device. The receiver 710 may be an example of aspects of the transceiver 920 or 1020 as described with reference to FIGS. 9 and 10. The receiver 710 may utilize a single antenna or a set of antennas.

Communications manager 715 may be an example of aspects of the communications manager 910 or 1010 as described with reference to FIGS. 9 and 10.

Communications manager 715 may also include transmission receiving component 720, decoding failure indicator 725, retransmission receiving component 730, decoding component 735, encoded bit transmitter 740, decoding failure component 745, and retransmission component 750.

Transmission receiving component 720 may receive a first set of encoded bits from a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels. Decoding failure indicator 725 may transmit, to the device, an indication that decoding of the first set of encoded bits was unsuccessful.

Retransmission receiving component 730 may receive a second set of encoded bits from the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set. Decoding component 735 may decode the second set of encoded bits according to the second polar code to obtain the information bit vector.

Encoded bit transmitter 740 may transmit a first set of encoded bits to a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels. Decoding failure component 745 may receive, from the device, an indication that decoding of the first set of encoded bits was unsuccessful.

Retransmission component 750 may transmit a second set of encoded bits to the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set.

Transmitter 755 may transmit signals generated by other components of the device. In some examples, the transmitter 755 may be collocated with a receiver 710 in a transceiver module. For example, the transmitter 755 may be an example of aspects of the transceiver 920 or 1020 as described with reference to FIGS. 9 and 10. The transmitter 755 may utilize a single antenna or a set of antennas.

Figure 8:
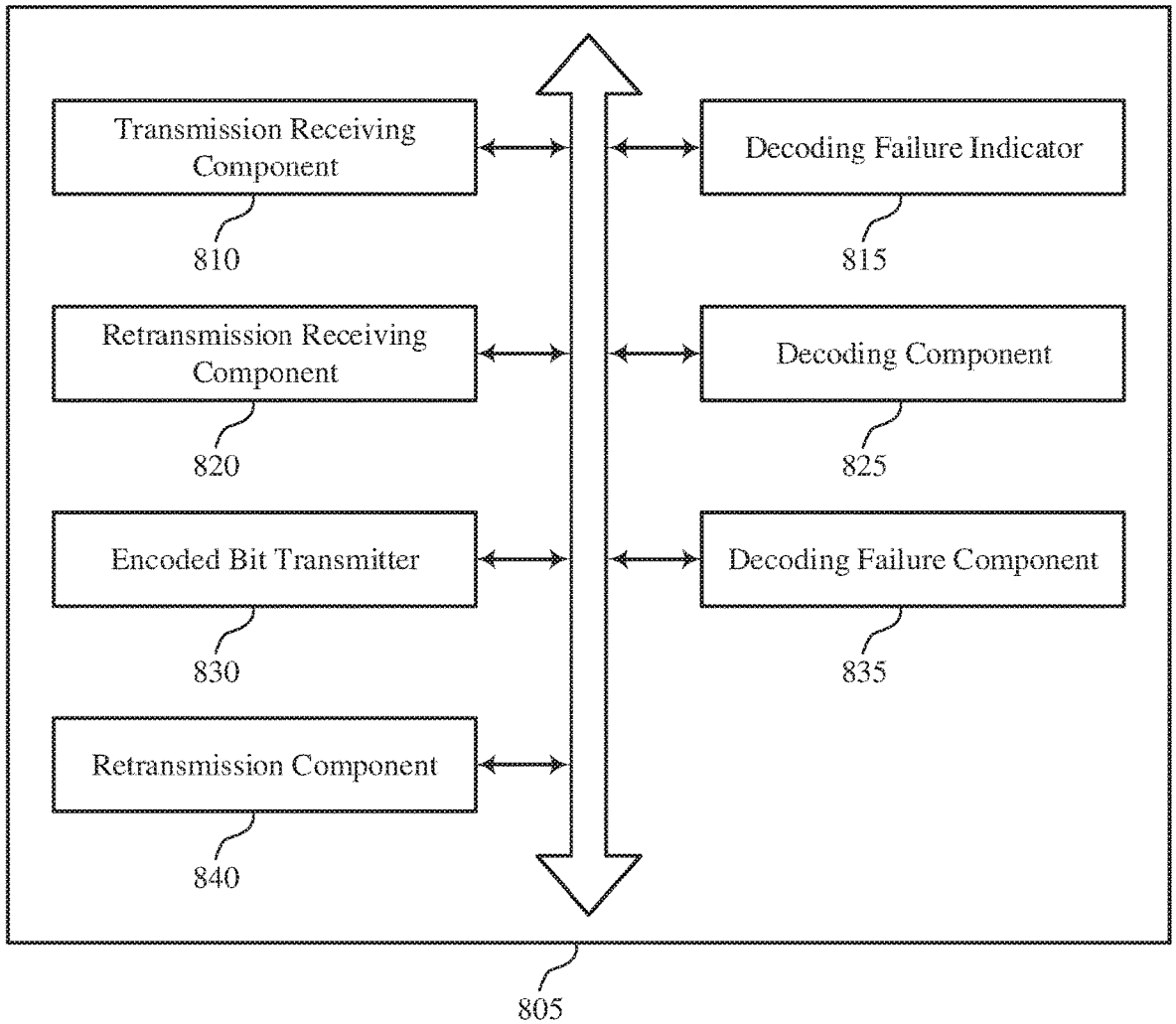

FIG. 8 shows a block diagram 800 of a communications manager 805 that supports self-decodable redundancy versions for polar codes in accordance with aspects of the present disclosure. The communications manager 805 may be an example of aspects of a communications manager 615, a communications manager 715, or a communications manager 910 described with reference to FIGS. 6, 7, and 9. The communications manager 805 may include transmission receiving component 810, decoding failure indicator 815, retransmission receiving component 820, decoding component 825, encoded bit transmitter 830, decoding failure component 835, and retransmission component 840. Each of these modules may communicate, directly or indirectly, with one another (e.g., via one or more buses).

Transmission receiving component 810 may receive a first set of encoded bits from a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels. In some cases, the first set of encoded bits includes a subset of encoded bits of a codeword generated by the first polar code. Decoding failure indicator 815 may transmit, to the device, an indication that decoding of the first set of encoded bits was unsuccessful.

Retransmission receiving component 820 may receive a second set of encoded bits from the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set. In some cases, the at least one of the second set of polarized bit channels includes bit channels of the third bit index set that are not in the first bit index set. In some cases, the second polar code includes the first polar code. In some cases, the second set of encoded bits includes a second subset of encoded bits of a second codeword generated by the second polar code. In some cases, the second set of encoded bits has a same bit length as the first set of encoded bits. In some cases, the second set of encoded bits has a different bit length as the first set of encoded bits. In some cases, the second polar code has a second code length that is two times the first code length. In some cases, a bit order for the at least one bit of the information bit vector in the at least one of the second set of polarized bit channels corresponds to an order of respective bit channel indices corresponding to the bit channels of the first bit index set that are not in the third bit index set.

Decoding component 825 may decode the second set of encoded bits according to the second polar code to obtain the information bit vector and decode the first and second sets of encoded bits according to the second polar code to obtain the information bit vector.

Encoded bit transmitter 830 may transmit a first set of encoded bits to a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels. In some cases, the first set of encoded bits includes a subset of encoded bits of a codeword generated by the first polar code. Decoding failure component 835 may receive, from the device, an indication that decoding of the first set of encoded bits was unsuccessful.

Retransmission component 840 may transmit a second set of encoded bits to the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set.

In some cases, the at least one of the second set of polarized bit channels includes bit channels of the third bit index set that are not in the first bit index set. In some cases, the second polar code includes the first polar code. In some cases, the second set of encoded bits includes a second subset of encoded bits of a second codeword generated by the second polar code. In some cases, the second set of encoded bits has a same bit length as the first set of encoded bits. In some cases, the second set of encoded bits has a different bit length as the first set of encoded bits. In some cases, the second polar code has a second code length that is two times the first code length. In some cases, a bit order for the at least one bit of the information bit vector in the at least one of the second set of polarized bit channels corresponds to an order of respective bit channel indices corresponding to the bit channels of the first bit index set that are not in the third bit index set.

Figure 9:
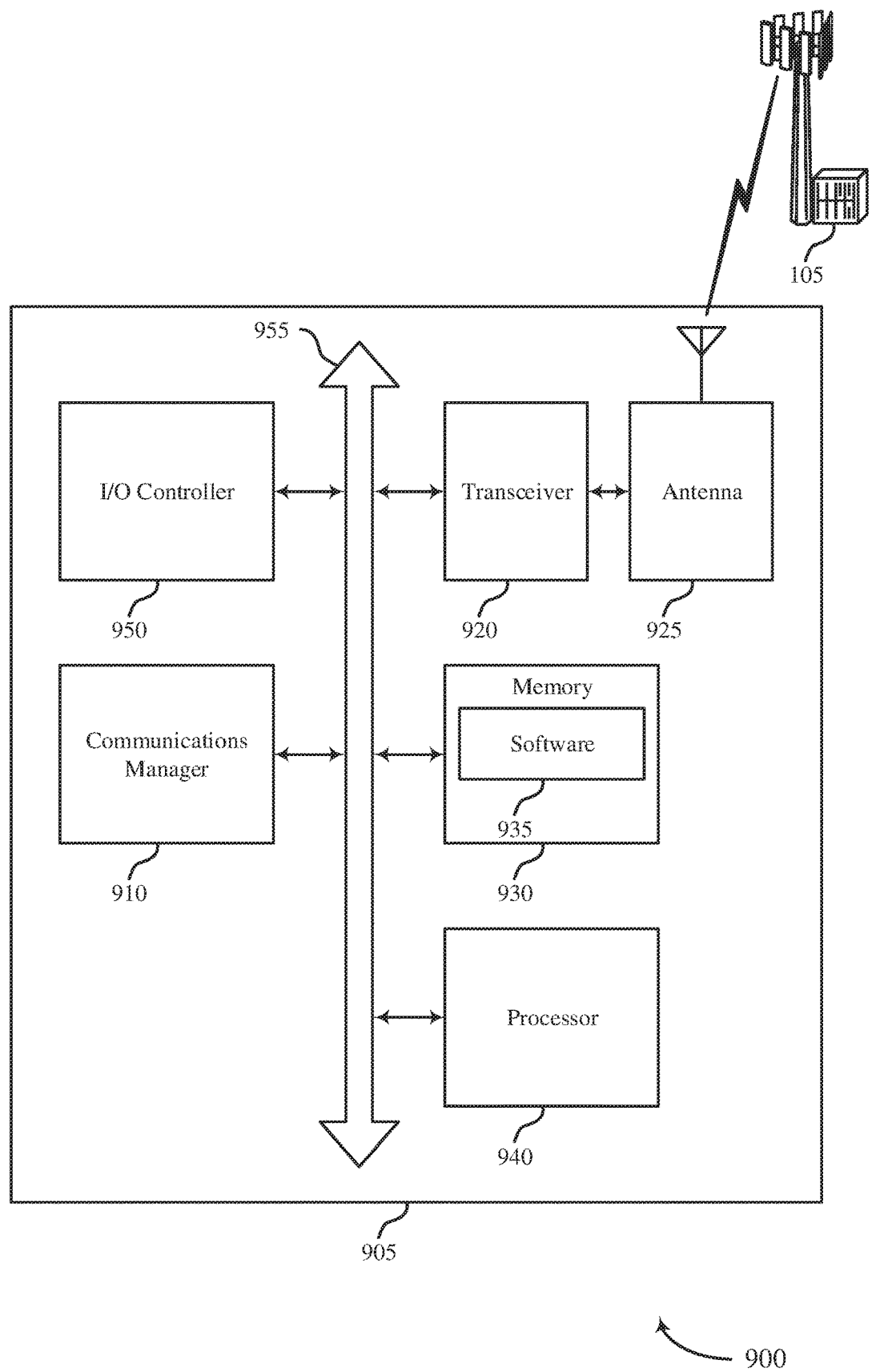
FIG. 9 illustrates a block diagram of a system including a user equipment (UE) that supports self-decodable redundancy versions for polar codes in accordance with aspects of the present disclosure.

FIG. 9 shows a diagram of a system 900 including a device 905 that supports self-decodable redundancy versions for polar codes in accordance with aspects of the present disclosure. Device 905 may be an example of or include the components of a wireless device 605, wireless device 705, or a UE 115 as described herein, e.g., with reference to FIGS. 6 and 7. Device 905 may include components for bi-directional voice and data communications including components for transmitting and receiving communications, including communications manager 910, transceiver 920, antenna 925, memory 930, processor 940, I/O controller 950, and software 935. These components may be in electronic communication via one or more buses (e.g., bus 955).

Transceiver 920 may communicate bi-directionally, via one or more antennas, wired, or wireless links as described herein. For example, the transceiver 920 may represent a wireless transceiver and may communicate bi-directionally with another wireless transceiver. The transceiver 920 may also include a modem to modulate the packets and provide the modulated packets to the antennas for transmission, and to demodulate packets received from the antennas.

In some cases, the wireless device may include a single antenna 925. However, in some cases the device may have more than one antenna 925, which may be capable of concurrently transmitting or receiving multiple wireless transmissions.

Memory 930 may include RAM and ROM. The memory 930 may store computer-readable, computer-executable software 935 including instructions that, when executed, cause the processor to perform various functions described herein. In some cases, the memory 930 may contain, among other things, a BIOS which may control basic hardware or software operation such as the interaction with peripheral components or devices.

Processor 940 may include an intelligent hardware device, (e.g., a general-purpose processor, a DSP, a central processing unit (CPU), a microcontroller, an ASIC, an FPGA, a PLD, a discrete gate or transistor logic component, a discrete hardware component, or any combination thereof). In some cases, processor 940 may be configured to operate a memory array using a memory controller. In other cases, a memory controller may be integrated into processor 940. Processor 940 may be configured to execute computer-readable instructions stored in a memory to perform various functions (e.g., functions or tasks supporting self-decodable redundancy versions for polar codes).

I/O controller 950 may manage input and output signals for device 905. I/O controller 950 may also manage peripherals not integrated into device 905. In some cases, I/O controller 950 may represent a physical connection or port to an external peripheral. In some cases, I/O controller 950 may utilize an operating system such as iOS®, ANDROID®, MS-DOS®, MS-WINDOWS®, OS/2®, UNIX®, LINUX®, or another known operating system. In other cases, I/O controller 950 may represent or interact with a modem, a keyboard, a mouse, a touchscreen, or a similar device. In some cases, I/O controller 950 may be implemented as part of a processor. In some cases, a user may interact with device 905 via I/O controller 950 or via hardware components controlled by I/O controller 950.

Software 935 may include code to implement aspects of the present disclosure, including code to support video conferencing and virtual appointments. Software 935 may be stored in a non-transitory computer-readable medium such as system memory or other memory. In some cases, the software 935 may not be directly executable by the processor but may cause a computer (e.g., when compiled and executed) to perform functions described herein.

Figure 10:
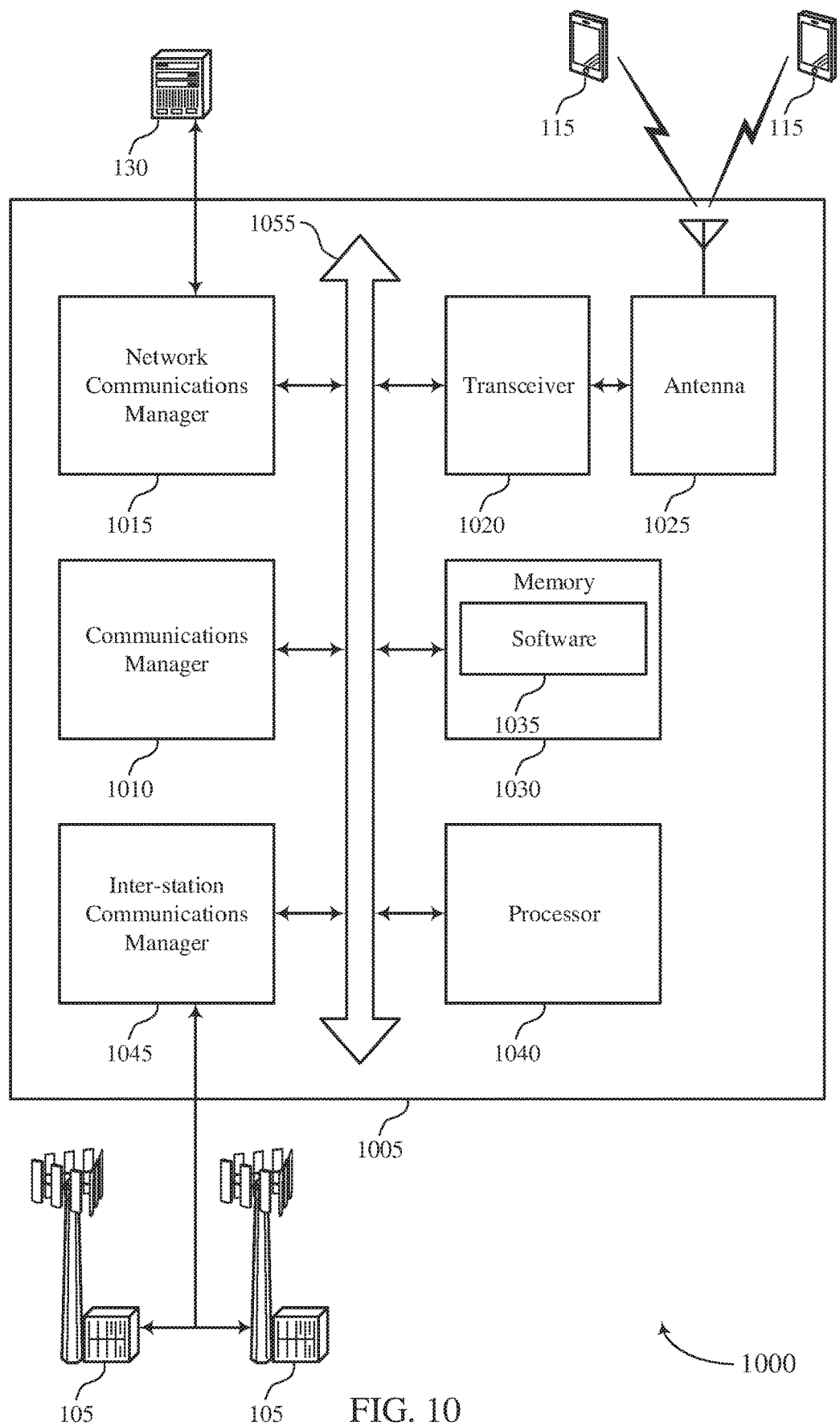
FIG. 10 illustrates a block diagram of a system including a base station that supports self-decodable redundancy versions for polar codes in accordance with aspects of the present disclosure.

FIG. 10 shows a diagram of a system 1000 including a device 1005 that supports self-decodable redundancy versions for polar codes in accordance with aspects of the present disclosure. Device 1005 may be an example of or include the components of wireless device 605, wireless device 705, or a base station 105 as described herein, e.g., with reference to FIGS. 6 and 7. Device 1005 may include components for bi-directional voice and data communications including components for transmitting and receiving communications, including communications manager 1010, network communications manager 1015, transceiver 1020, antenna 1025, memory 1030, processor 1040, inter-station communications manager 1045, and software 1035. These components may be in electronic communication via one or more buses (e.g., bus 1055).

Network communications manager 1015 may manage communications with the core network (e.g., via one or more wired backhaul links). For example, the network communications manager 1015 may manage the transfer of data communications for client devices, such as one or more UEs 115.

Transceiver 1020 may communicate bi-directionally, via one or more antennas, wired, or wireless links as described herein. For example, the transceiver 1020 may represent a wireless transceiver and may communicate bi-directionally with another wireless transceiver. The transceiver 1020 may also include a modem to modulate the packets and provide the modulated packets to the antennas for transmission, and to demodulate packets received from the antennas.

In some cases, the wireless device may include a single antenna 1025. However, in some cases the device may have more than one antenna 1025, which may be capable of concurrently transmitting or receiving multiple wireless transmissions.

Memory 1030 may include random-access memory (RAM) and read-only memory (ROM). The memory 1030 may store computer-readable, computer-executable software 1035 including instructions that, when executed, cause the processor to perform various functions described herein. In some cases, the memory 1030 may contain, among other things, a BIOS which may control basic hardware or software operation such as the interaction with peripheral components or devices.

Processor 1040 may include an intelligent hardware device, (e.g., a general-purpose processor, a DSP, a CPU, a microcontroller, an ASIC, an FPGA, a PLD, a discrete gate or transistor logic component, a discrete hardware component, or any combination thereof). In some cases, processor 1040 may be configured to operate a memory array using a memory controller. In other cases, a memory controller may be integrated into processor 1040. Processor 1040 may be configured to execute computer-readable instructions stored in a memory to perform various functions (e.g., functions or tasks supporting self-decodable redundancy versions for polar codes).

Inter-station communications manager 1045 may manage communications with other base station 105 and may include a controller or scheduler for controlling communications with UEs 115 in cooperation with other base stations 105. For example, the inter-station communications manager 1045 may coordinate scheduling for transmissions to UEs 115 for various interference mitigation techniques such as beamforming or joint transmission. In some examples, inter-station communications manager 1045 may provide an X2 interface within an LTE/LTE-A wireless communication network technology to provide communication between base stations 105.

Software 1035 may include code to implement aspects of the present disclosure, including code to support video conferencing and virtual appointments. Software 1035 may be stored in a non-transitory computer-readable medium such as system memory or other memory. In some cases, the software 1035 may not be directly executable by the processor but may cause a computer (e.g., when compiled and executed) to perform functions described herein.

Figure 11:
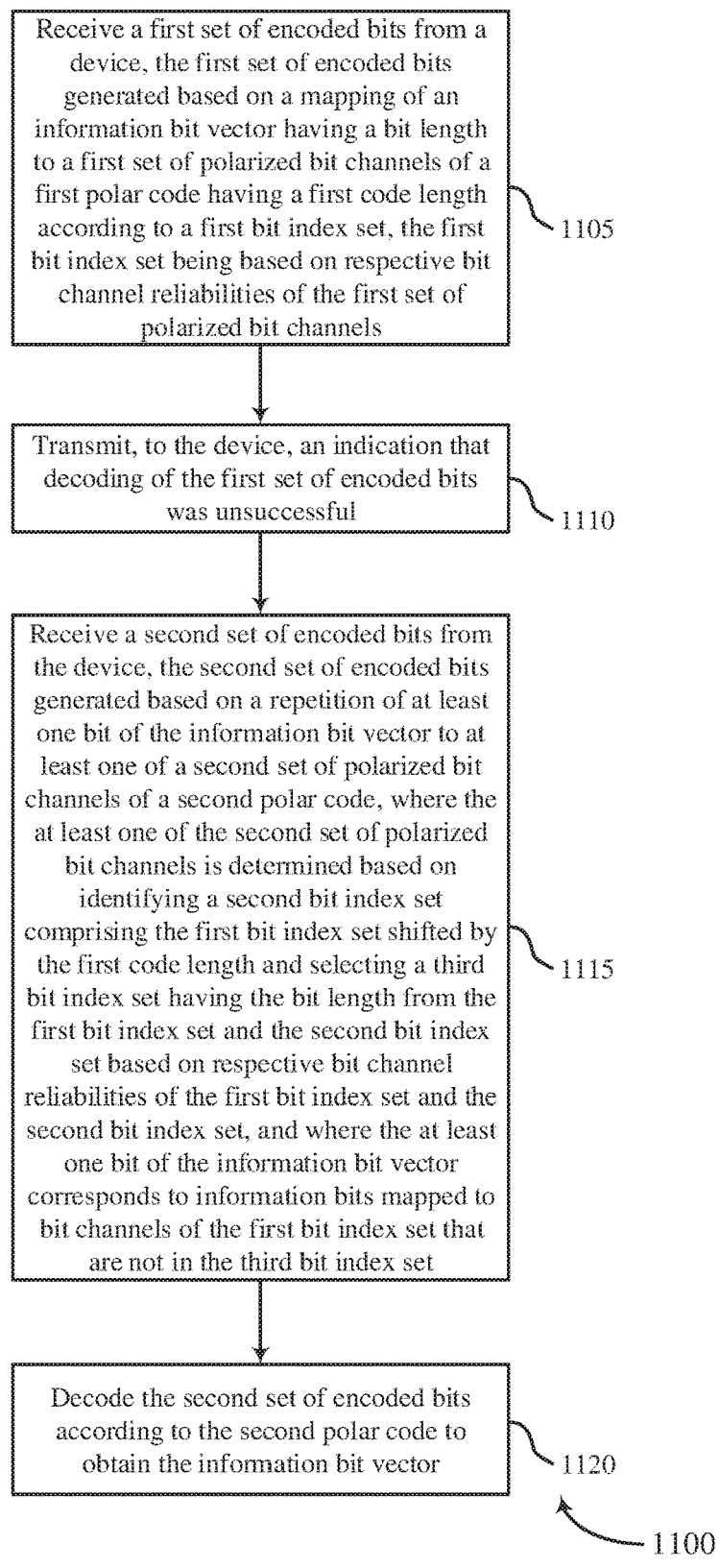
FIGS. 11 and 12 illustrate methods for self-decodable redundancy versions for polar codes in accordance with aspects of the present disclosure.

FIG. 11 shows a flowchart illustrating a method 1100 for self-decodable redundancy versions for polar codes in accordance with aspects of the present disclosure. The operations of method 1100 may be implemented by a wireless device, such as a UE 115 or base station 105, or its components as described herein. For example, the operations of method 1100 may be performed by a communications manager as described with reference to FIGS. 6 to 10. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At 1105 the UE 115 or base station 105 may receive a first set of encoded bits from a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels. The operations of 1105 may be performed according to the methods described herein. In certain examples, aspects of the operations of 1105 may be performed by a transmission receiving component as described with reference to FIGS. 6 to 10.

At 1110 the UE 115 or base station 105 may transmit, to the device, an indication that decoding of the first set of encoded bits was unsuccessful. The operations of 1110 may be performed according to the methods described herein. In certain examples, aspects of the operations of 1110 may be performed by a decoding failure indicator as described with reference to FIGS. 6 to 10.

At 1115 the UE 115 or base station 105 may receive a second set of encoded bits from the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set. The operations of 1115 may be performed according to the methods described herein. In certain examples, aspects of the operations of 1115 may be performed by a retransmission receiving component as described with reference to FIGS. 6 to 10.

At 1120 the UE 115 or base station 105 may decode the second set of encoded bits according to the second polar code to obtain the information bit vector. The operations of 1120 may be performed according to the methods described herein. In certain examples, aspects of the operations of 1120 may be performed by a decoding component as described with reference to FIGS. 6 to 10.

Figure 12:
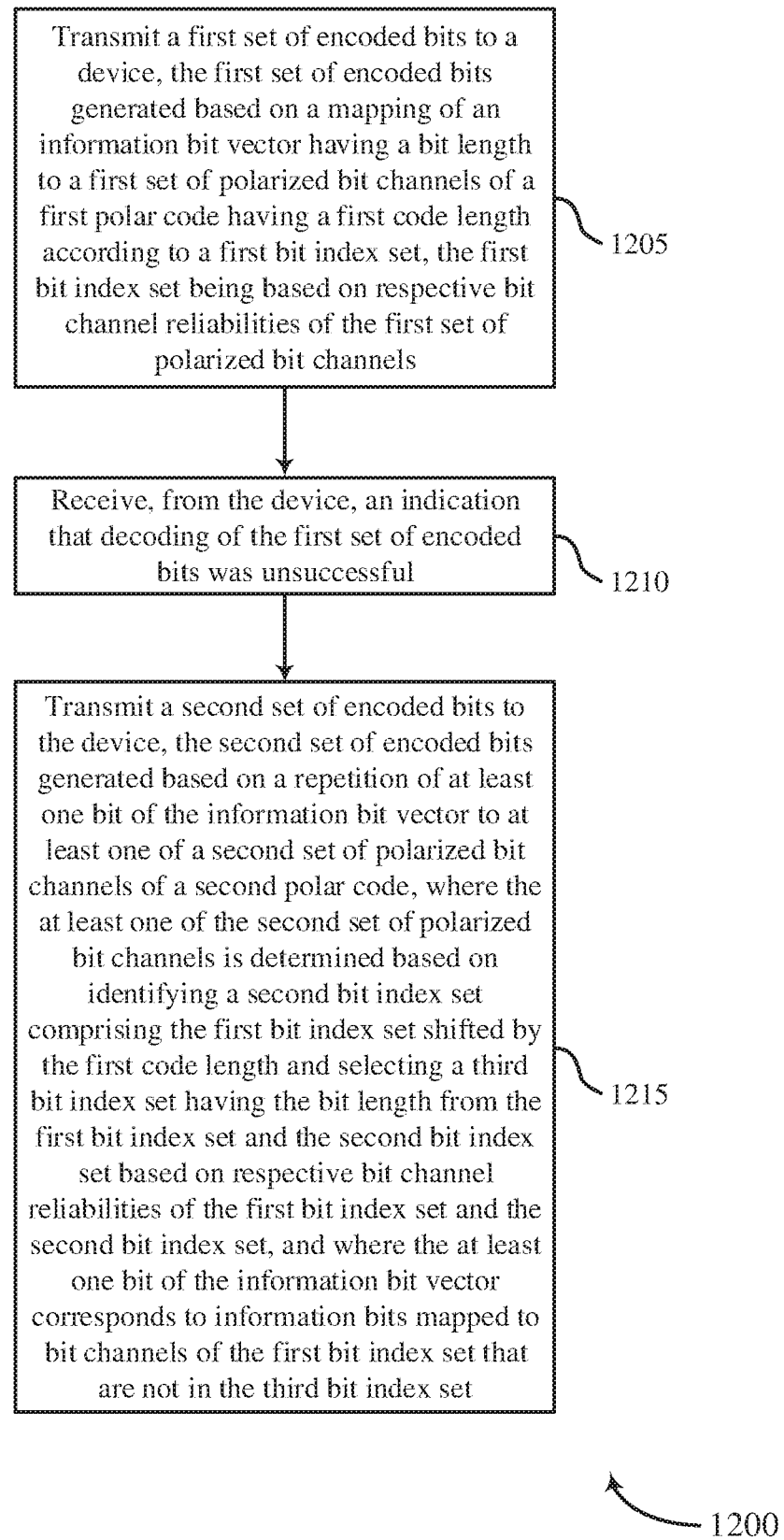

FIG. 12 shows a flowchart illustrating a method 1200 for self-decodable redundancy versions for polar codes in accordance with aspects of the present disclosure. The operations of method 1200 may be implemented by a wireless device, such as a UE 115 or base station 105 or its components as described herein. For example, the operations of method 1200 may be performed by a communications manager as described with reference to FIGS. 6 to 10. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At 1205 the UE 115 or base station 105 may transmit a first set of encoded bits to a device, the first set of encoded bits generated based on a mapping of an information bit vector having a bit length to a first set of polarized bit channels of a first polar code having a first code length according to a first bit index set, the first bit index set being based on respective bit channel reliabilities of the first set of polarized bit channels. The operations of 1205 may be performed according to the methods described herein. In certain examples, aspects of the operations of 1205 may be performed by an encoded bit transmitter as described with reference to FIGS. 6 to 10.

At 1210 the UE 115 or base station 105 may receive, from the device, an indication that decoding of the first set of encoded bits was unsuccessful. The operations of 1210 may be performed according to the methods described herein. In certain examples, aspects of the operations of 1210 may be performed by a decoding failure component as described with reference to FIGS. 6 to 10.

At 1215 the UE 115 or base station 105 may transmit a second set of encoded bits to the device, the second set of encoded bits generated based on a repetition of at least one bit of the information bit vector to at least one of a second set of polarized bit channels of a second polar code, where the at least one of the second set of polarized bit channels is determined based on identifying a second bit index set comprising the first bit index set shifted by the first code length and selecting a third bit index set having the bit length from the first bit index set and the second bit index set based on respective bit channel reliabilities of the first bit index set and the second bit index set, and where the at least one bit of the information bit vector corresponds to information bits mapped to bit channels of the first bit index set that are not in the third bit index set. The operations of 1215 may be performed according to the methods described herein. In certain examples, aspects of the operations of 1215 may be performed by a retransmission component as described with reference to FIGS. 6 to 10.

It should be noted that the methods described herein describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), E-UTRA, Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other PLD, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include RAM, ROM, electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communication, comprising:
  receiving a first set of encoded bits from a device, the first set of encoded bits generated based at least in part on a mapping of an information bit vector having a bit length to a first set of polarized bit channels of a first polar code having a first code length according to a first bit index set, the first bit index set being based on respective bit channel reliabilities of the first set of polarized bit channels;
  transmitting, to the device, an indication that decoding of the first set of encoded bits was unsuccessful;
  receiving a second set of encoded bits from the device, the second set of encoded bits generated based at least in part on a repetition of at least one bit of the information bit vector to at least one of a second set of polarized bit channels of a second polar code, wherein the at least one of the second set of polarized bit channels is determined based at least in part on identifying a second bit index set comprising the first bit index set shifted by the first code length and selecting a third bit index set having the bit length from the first bit index set and the second bit index set based on respective bit channel reliabilities of the first bit index set and the second bit index set, and wherein the at least one bit of the information bit vector corresponds to information bits mapped to bit channels of the first bit index set that are not in the third bit index set; and decoding the second set of encoded bits according to the second polar code to obtain the information bit vector.

2. The method of claim 1, wherein the at least one of the second set of polarized bit channels comprises bit channels of the third bit index set that are not in the first bit index set.

3. The method of claim 1, wherein the decoding comprises:

decoding the first and second sets of encoded bits according to the second polar code to obtain the information bit vector.

4. The method of claim 1, wherein the second polar code comprises the first polar code.

5. The method of claim 1, wherein the first set of encoded bits comprises a subset of encoded bits of a codeword generated by the first polar code.

6. The method of claim 5, wherein the second set of encoded bits comprises a second subset of encoded bits of a second codeword generated by the second polar code.

7. The method of claim 1, wherein the second set of encoded bits has a same bit length as the first set of encoded bits.

8. The method of claim 1, wherein the second set of encoded bits has a different bit length as the first set of encoded bits.

9. The method of claim 1, wherein the second polar code has a second code length that is two times the first code length.

10. The method of claim 1, wherein a bit order for the at least one bit of the information bit vector in the at least one of the second set of polarized bit channels corresponds to an order of respective bit channel indices corresponding to the bit channels of the first bit index set that are not in the third bit index set.

11. A method for wireless communication, comprising:

transmitting a first set of encoded bits to a device, the first set of encoded bits generated based at least in part on a mapping of an information bit vector having a bit length to a first set of polarized bit channels of a first polar code having a first code length according to a first bit index set, the first bit index set being based on respective bit channel reliabilities of the first set of polarized bit channels;

receiving, from the device, an indication that decoding of the first set of encoded bits was unsuccessful; and transmitting a second set of encoded bits to the device, the second set of encoded bits generated based at least in part on a repetition of at least one bit of the information bit vector to at least one of a second set of polarized bit channels of a second polar code, wherein the at least one of the second set of polarized bit channels is determined based at least in part on identifying a second bit index set comprising the first bit index set shifted by the first code length and selecting a third bit index set having the bit length from the first bit index set and the second bit index set based on respective bit channel reliabilities of the first bit index set and the second bit index set, and wherein the at least one bit of the information bit vector corresponds to information bits mapped to bit channels of the first bit index set that are not in the third bit index set.

12. The method of claim 11, wherein the at least one of the second set of polarized bit channels comprises bit channels of the third bit index set that are not in the first bit index set.

13. The method of claim 11, wherein the second polar code comprises the first polar code.

14. The method of claim 11, wherein the first set of encoded bits comprises a subset of encoded bits of a codeword generated by the first polar code.

15. The method of claim 14, wherein the second set of encoded bits comprises a second subset of encoded bits of a second codeword generated by the second polar code.

16. The method of claim 11, wherein the second set of encoded bits has a same bit length as the first set of encoded bits.

17. The method of claim 11, wherein the second set of encoded bits has a different bit length as the first set of encoded bits.

18. The method of claim 11, wherein the second polar code has a second code length that is two times the first code length.

19. The method of claim 11, wherein a bit order for the at least one bit of the information bit vector in the at least one of the second set of polarized bit channels corresponds to an order of respective bit channel indices corresponding to the bit channels of the first bit index set that are not in the third bit index set.

20. An apparatus for wireless communication, comprising:

means for receiving a first set of encoded bits from a device, the first set of encoded bits generated based at least in part on a mapping of an information bit vector having a bit length to a first set of polarized bit channels of a first polar code having a first code length according to a first bit index set, the first bit index set being based on respective bit channel reliabilities of the first set of polarized bit channels;

means for transmitting, to the device, an indication that decoding of the first set of encoded bits was unsuccessful;

means for receiving a second set of encoded bits from the device, the second set of encoded bits generated based at least in part on a repetition of at least one bit of the information bit vector to at least one of a second set of polarized bit channels of a second polar code, wherein the at least one of the second set of polarized bit channels is determined based at least in part on identifying a second bit index set comprising the first bit index set shifted by the first code length and selecting a third bit index set having the bit length from the first bit index set and the second bit index set based on respective bit channel reliabilities of the first bit index set and the second bit index set, and wherein the at least one bit of the information bit vector corresponds to information bits mapped to bit channels of the first bit index set that are not in the third bit index set; and means for decoding the second set of encoded bits according to the second polar code to obtain the information bit vector.

21. The apparatus of claim 20, wherein the at least one of the second set of polarized bit channels comprises bit channels of the third bit index set that are not in the first bit index set.

22. The apparatus of claim 20, wherein the decoding comprises:

means for decoding the first and second sets of encoded bits according to the second polar code to obtain the information bit vector.

23. The apparatus of claim 20, wherein the second polar code comprises the first polar code.

24. The apparatus of claim 20, wherein the first set of encoded bits comprises a subset of encoded bits of a codeword generated by the first polar code.

25. The apparatus of claim 24, wherein the second set of encoded bits comprises a second subset of encoded bits of a second codeword generated by the second polar code.

26. The apparatus of claim 20, wherein the second set of encoded bits has a same bit length as the first set of encoded bits.

27. The apparatus of claim 20, wherein the second set of encoded bits has a different bit length as the first set of encoded bits.

28. The apparatus of claim 20, wherein the second polar code has a second code length that is two times the first code length.

29. The apparatus of claim 20, wherein a bit order for the at least one bit of the information bit vector in the at least one of the second set of polarized bit channels corresponds to an order of respective bit channel indices corresponding to the bit channels of the first bit index set that are not in the third bit index set.

30. An apparatus for wireless communication, comprising:
means for transmitting a first set of encoded bits to a device, the first set of encoded bits generated based at least in part on a mapping of an information bit vector having a bit length to a first set of polarized bit channels of a first polar code having a first code length according to a first bit index set, the first bit index set being based on respective bit channel reliabilities of the first set of polarized bit channels;
means for receiving, from the device, an indication that decoding of the first set of encoded bits was unsuccessful; and
means for transmitting a second set of encoded bits to the device, the second set of encoded bits generated based at least in part on a repetition of at least one bit of the information bit vector to at least one of a second set of polarized bit channels of a second polar code, wherein the at least one of the second set of polarized bit channels is determined based at least in part on identifying a second bit index set comprising the first bit index set shifted by the first code length and selecting a third bit index set having the bit length from the first bit index set and the second bit index set based on respective bit channel reliabilities of the first bit index set and the second bit index set, and wherein the at least one bit of the information bit vector corresponds to information bits mapped to bit channels of the first bit index set that are not in the third bit index set.

31. The apparatus of claim 30, wherein the at least one of the second set of polarized bit channels comprises bit channels of the third bit index set that are not in the first bit index set.

32. The apparatus of claim 30, wherein the second polar code comprises the first polar code.

33. The apparatus of claim 30, wherein the first set of encoded bits comprises a subset of encoded bits of a codeword generated by the first polar code.

34. The apparatus of claim 33, wherein the second set of encoded bits comprises a second subset of encoded bits of a second codeword generated by the second polar code.

35. The apparatus of claim 30, wherein the second set of encoded bits has a same bit length as the first set of encoded bits.

36. The apparatus of claim 30, wherein the second set of encoded bits has a different bit length as the first set of encoded bits.

37. The apparatus of claim 30, wherein the second polar code has a second code length that is two times the first code length.

38. The apparatus of claim 30, wherein a bit order for the at least one bit of the information bit vector in the at least one of the second set of polarized bit channels corresponds to an order of respective bit channel indices corresponding to the bit channels of the first bit index set that are not in the third bit index set.

39. An apparatus for wireless communication, comprising:
a processor,
memory in electronic communication with the processor; and
instructions stored in the memory and executable by the processor to cause the apparatus to:
receive a first set of encoded bits from a device, the first set of encoded bits generated based at least in part on a mapping of an information bit vector having a bit length to a first set of polarized bit channels of a first polar code having a first code length according to a first bit index set, the first bit index set being based on respective bit channel reliabilities of the first set of polarized bit channels;
transmit, to the device, an indication that decoding of the first set of encoded bits was unsuccessful;
receive a second set of encoded bits from the device, the second set of encoded bits generated based at least in part on a repetition of at least one bit of the information bit vector to at least one of a second set of polarized bit channels of a second polar code, wherein the at least one of the second set of polarized bit channels is determined based at least in part on identifying a second bit index set comprising the first bit index set shifted by the first code length and selecting a third bit index set having the bit length from the first bit index set and the second bit index set based on respective bit channel reliabilities of the first bit index set and the second bit index set, and wherein the at least one bit of the information bit vector corresponds to information bits mapped to bit channels of the first bit index set that are not in the third bit index set; and
decode the second set of encoded bits according to the second polar code to obtain the information bit vector.

40. An apparatus for wireless communication, comprising:
a processor,
memory in electronic communication with the processor; and
instructions stored in the memory and executable by the processor to cause the apparatus to:
transmit a first set of encoded bits to a device, the first set of encoded bits generated based at least in part on a mapping of an information bit vector having a bit length to a first set of polarized bit channels of a first polar code having a first code length according to a first bit index set, the first bit index set being based on respective bit channel reliabilities of the first set of polarized bit channels;

receive, from the device, an indication that decoding of the first set of encoded bits was unsuccessful; and transmit a second set of encoded bits to the device, the second set of encoded bits generated based at least in part on a repetition of at least one bit of the information bit vector to at least one of a second set of polarized bit channels of a second polar code, wherein the at least one of the second set of polarized bit channels is determined based at least in part on identifying a second bit index set comprising the first bit index set shifted by the first code length and selecting a third bit index set having the bit length from the first bit index set and the second bit index set based on respective bit channel reliabilities of the first bit index set and the second bit index set, and wherein the at least one bit of the information bit vector corresponds to information bits mapped to bit channels of the first bit index set that are not in the third bit index set.

41. A non-transitory computer-readable medium storing code for wireless communication, the code comprising instructions executable by a processor to:

receive a first set of encoded bits from a device, the first set of encoded bits generated based at least in part on a mapping of an information bit vector having a bit length to a first set of polarized bit channels of a first polar code having a first code length according to a first bit index set, the first bit index set being based on respective bit channel reliabilities of the first set of polarized bit channels;

transmit, to the device, an indication that decoding of the first set of encoded bits was unsuccessful;

receive a second set of encoded bits from the device, the second set of encoded bits generated based at least in part on a repetition of at least one bit of the information bit vector to at least one of a second set of polarized bit channels of a second polar code, wherein the at least one of the second set of polarized bit channels is determined based at least in part on identifying a second bit index set comprising the first bit index set shifted by the first code length and selecting a third bit index set having the bit length from the first bit index set and the second bit index set based on respective bit channel reliabilities of the first bit index set and the second bit index set, and wherein the at least one bit of the information bit vector corresponds to information bits mapped to bit channels of the first bit index set that are not in the third bit index set; and decode the second set of encoded bits according to the second polar code to obtain the information bit vector.

42. A non-transitory computer-readable medium storing code for wireless communication, the code comprising instructions executable by a processor to:

transmit a first set of encoded bits to a device, the first set of encoded bits generated based at least in part on a mapping of an information bit vector having a bit length to a first set of polarized bit channels of a first polar code having a first code length according to a first bit index set, the first bit index set being based on respective bit channel reliabilities of the first set of polarized bit channels;

receive, from the device, an indication that decoding of the first set of encoded bits was unsuccessful; and transmit a second set of encoded bits to the device, the second set of encoded bits generated based at least in part on a repetition of at least one bit of the information bit vector to at least one of a second set of polarized bit channels of a second polar code, wherein the at least one of the second set of polarized bit channels is determined based at least in part on identifying a second bit index set comprising the first bit index set shifted by the first code length and selecting a third bit index set having the bit length from the first bit index set and the second bit index set based on respective bit channel reliabilities of the first bit index set and the second bit index set, and wherein the at least one bit of the information bit vector corresponds to information bits mapped to bit channels of the first bit index set that are not in the third bit index set.

* * * * *